(12) United States Patent
Iwane et al.

(10) Patent No.: US 6,231,667 B1
(45) Date of Patent: May 15, 2001

(54) LIQUID PHASE GROWTH METHOD AND LIQUID PHASE GROWTH APPARATUS

(75) Inventors: Masaaki Iwane, Atsugi; Isao Tanikawa, Hiratsuka; Katsumi Nakagawa, Atsugi; Tatsumi Shoji; Shoji Nishida, both of Hiratsuka; Noritaka Ukiyo, Atsugi, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/200,867

(22) Filed: Nov. 27, 1998

(30) Foreign Application Priority Data

Nov. 28, 1997 (JP) .................................................. 9-328187

(51) Int. Cl.$^7$ .................................................. C30B 19/06
(52) U.S. Cl. .............................. 117/55; 117/60; 117/934; 118/412
(58) Field of Search .............................. 117/60, 934, 55; 118/412

(56) References Cited

U.S. PATENT DOCUMENTS

| 3,648,653 | * | 3/1972 | Vehse | 117/60 |
| 4,032,370 | * | 6/1977 | Matare | 117/60 |
| 4,160,682 | * | 7/1979 | Esseluhn | 117/60 |
| 4,243,472 | * | 1/1981 | O'Neill | 117/60 |
| 4,778,478 | | 10/1988 | Barnett | 437/5 |
| 5,544,616 | | 8/1996 | Ciszek et al. | 117/60 |
| 5,922,126 | * | 7/1999 | Furukawa et al. | 117/60 |

FOREIGN PATENT DOCUMENTS

| 57-076821 | * | 5/1982 | (JP) | 117/60 |
| 08213645 | | 8/1996 | (JP) . | |
| 62-083398 | * | 4/1987 | (KP) | 117/54 |

* cited by examiner

Primary Examiner—Robert Kunemund
(74) Attorney, Agent, or Firm—Fitzpatrick, Cella, Harper & Scinto

(57) ABSTRACT

A liquid phase growth apparatus of a dipping system has a plurality of liquid phase growth chambers and liquid phase growth operations of semiconductors are carried out on a plurality of substrates in the growth chambers. Another liquid phase growth apparatus of the dipping system has a liquid phase growth chamber and an annealing chamber, and is constructed in such structure that liquid phase growth of a semiconductor on one substrate is carried out in the liquid phase growth chamber and that an annealing operation of another substrate different from the aforementioned substrate is carried out in the annealing chamber. Another liquid phase growth apparatus of the dipping system has a liquid phase growth chamber and an annealing chamber, and is constructed in such structure that a semiconductor material is dissolved into a solvent in the liquid phase growth chamber and that the annealing operation of a substrate is carried out in the annealing chamber. These provide the liquid phase growth apparatus for formation of semiconductor layer in the dipping system, suitably applicable to mass production of large-area devices such as solar cells. In addition, the liquid phase growth method is also provided.

20 Claims, 22 Drawing Sheets

FIG. 7

SEQUENCE FOR 3 VESSEL TYPE
LIQUID PHASE GROWTH APPARATUS (A: FIRST BATCH)
(B: SECOND BATCH)

| TIME (MINUTES) | 10 20 30 40 50 | 60 70 80 90 100 110 | 120 130 140 150 160 170 | 180 190 200 210 220 230 |
|---|---|---|---|---|
| 1 L/C | A LOADING 20 | B LOADING 20 | | |
| 2 H₂ ANNEALING | WARM-UP 30 — A ANNEAL 10 | WARM-UP 30 — B ANNEAL 10 | | |
| 3 Epi (p⁺ LAYER) | RAW MATERIAL SUPPLY 20 | A GROWTH 10 — HOLD 10 | B GROWTH 10 — HOLD 10 | |
| 4 Epi (p⁻ LAYER) | | RAW MATERIAL SUPPLY 20 | A GROWTH 30 — HOLD 10 | B GROWTH 30 — HOLD 10 |
| 5 Epi (n⁺ LAYER) | | | RAW MATERIAL SUPPLY 20 — A GROWTH 10 — HOLD 10 | RAW MATERIAL SUPPLY 20 — B GROWTH 10 — HOLD 10 |
| 6 UL/C | | | COOLING 55 | UNLOADING 5  COOLING 55 |

FIG. 14  SEQUENCE FOR 5 VESSEL TYPE LIQUID PHASE GROWTH APPARATUS  (A: FIRST BATCH / B: SECOND BATCH)

| TIME (MINUTES) | 10 20 30 40 50 | 70 80 90 100 110 | 130 140 150 160 170 | 190 200 210 220 230 |
|---|---|---|---|---|
| L/C | A  LOADING 20 | B  LOADING 20 | | |
| H₂ ANNEALING | A  WARM-UP 30  ANNEALING 10 | B  WARM-UP 30  ANNEALING 10 | | |
| Epi (p⁻ LAYER) | RAW MATERIAL SUPPLY 20 | A  WARM-UP  HOLD 10  RAW MATERIAL SUPPLY 20  GROWTH 30 | B  GROWTH 30  HOLD 10 | |
| Epi (n⁺ LAYER) | | A  RAW MATERIAL SUPPLY 20  HOLD 10  GROWTH 10 | B  RAW MATERIAL SUPPLY 20  HOLD 10  GROWTH 10 | |
| UL/C | | | A  COOLING 55  UNLOADING 5 | B  COOLING 55  UNLOADING 5 |

TO VACUUM OR ARGON INLET

US 6,231,667 B1

LIQUID PHASE GROWTH METHOD AND LIQUID PHASE GROWTH APPARATUS

BACKGROUND OF THE INVENTION

1. Field of the Invention

The present invention relates to a liquid phase growth method an a liquid phase growth apparatus and, more particularly, to a liquid phase growth method or a liquid phase growth apparatus that can be applied to production of such devices as solar cells or photosensors.

2. Related Background Art

Emission of greenhouse-effect gases such as carbon dioxide and nitrogen oxides, resulting from combustion of petroleum in thermal power generation, combustion of gasoline in engines of cars, and so on, is responsible for deterioration of the global environments. There are also worries that crude oil will have been exhausted in the future, and attention thus has been focused on power generation using the solar cells.

Since thin film crystalline Si solar cells have a thin electricity-generating layer and use a small amount the raw material of Si, they can be produced at lower cost. Since the electricity-generating layer is crystalline Si, higher conversion efficiency and less deterioration can be expected, as compared with the solar cells amorphous Si or the like. Further, the thin film crystalline Si solar cells can be bent to some extent, and they can thus be used as being bonded to a curved surface, e.g. a body of a car, a household electrical appliance, a rood file, and so on.

For implementing the thin film crystalline Si solar cells, Japanese Patent Application Laid-Open No. 8-213645 discloses that thin-film single-crystal Si epitaxially grown is separated through a porous Si layer. FIG. 20 is a sectional view to show a method for forming a solar cell of thin film Si described in Japanese Patent Application Laid-Open No. 8-213645. In the figure, reference numeral 101 designates a Si wafer, 102 a porous Si layer, 103 a p$^+$ Si layer, 104 a p$^-$ Si layer, 105 a n$^+$ Si layer, 106 a protective film, 109, 111 an adhesive, and 110, 112 a jig. In the production method of solar cell of FIG. 20, the porous Si layer 102 is formed in the surface of Si wafer 101 by anodization. After that, the p$^-$ Si layer 103 is epitaxially grown on the porous Si layer 102 and then the p$^-$ Si layer 104 and n$^-$ Si layer 105 are further grown thereon. Then the protective layer 106 is formed. After that, the adhesive 111, 109 is applied onto the protective layer 106 and onto the Si wafer 101, which are bonded to the jig 112, 110. After that, tensile force is exerted on the jig 112, 110 so as to separate the Si wafer 101 from the epitaxial Si layers 103, 104, 105 through the porous Si layer 102. Then the solar cell is formed in the epitaxial Si layers 103, 104, 105 and the Si wafer 101 is again used in like steps, thereby achieving cost reduction.

There are liquid phase growth methods as methods for forming single-crystal Si or polycrystal Si. The liquid phase growth methods permit the thick Si layers necessary for the electricity-generating layer of a solar cell to be produced at lower cost than such methods as CVD (Chemical Vapor Deposition). A specific example of the liquid phase growth method is disclosed in U.S. Pat. No. 4,778,478. FIG. 21 is a sectional view of a liquid phase growth apparatus of a sliding method disclosed in U.S. Pat. No. 4,778,478. In the figure, reference numeral 50 denotes a sliding boat of a fire-resistive material such as graphite, 54, 56 liquid baths, 58 a movable slide comprised of a metal substrate, 60 a recessed part in the bottom surface of the boat, 63 a barrier layer, 68, 70 solvents, 72 a section for adhering a transparent conductive electrode, 75 a nozzle for forming an antireflection film, 74 a chamber thereof, 76 a wheel, and 78 a nozzle for forming the barrier layer. First, the movable slide 58 rolled up around the wheel 76 is unrolled and the barrier layer 63 is formed thereon by the nozzle 78. Then semiconductor layers to become the electricity-generating layer are formed by liquid phase growth from the solvents 68, 70 in the baths 54, 56. Thereafter, the transparent electrode is formed at the section 72 for adhering the transparent conductive electrode, and the antireflection film is formed by the nozzle 75, thereby completing the solar cell. This liquid phase growth method of the sliding method has high efficiency of liquid phase growth and is thus advantageous in mass production of solar cells.

U.S. Pat. No. 5,544,616 discloses another liquid phase growth apparatus of a dipping system. A sectional view of this liquid phase growth apparatus is illustrated in FIG. 22. In the figure, numeral 201 represents an exit, 202 a quartz crucible, 203 a graphite boat, 204 a heater, 205 an inlet of argon gas, 206 a thermocouple, 208 a lid, 209 an insulating region, and 210 a support base of graphite. The apparatus of U.S. Pat. No. 5,544,616 forms a semiconductor layer on a growth substrate by dipping the growth substrate in the solvent stored in the quartz crucible 202.

In the case wherein the semiconductor layer is intended to be formed by liquid phase growth on a wafer as a substrate as it is, the sliding boat larger than the size of the wafer has to be prepared in the sliding method, e.g., in U.S. Pat. No. 4,778,478. It is, however, not easy to fabricate the sliding boat in a large scale, because it is made of the heat-resistant material such as graphite. In this aspect, the liquid phase growth apparatus of the sliding method is disadvantageous in producing large-area devices such as the solar cells or the photosensors. Therefore, the larger the size of the wafer, the more disadvantageous the use of the liquid phase growth apparatus of the sliding method.

Further, since the liquid phase growth apparatus using the dipping system as disclosed in U.S. Pat. No. 5,544,616 etc. excels in the liquid phase growth of large areas, it is advantageous in the case of the wafer being used as a substrate as it is, but is disadvantageous in continuous formation of the semiconductor layers such as the p-layer and n-layer.

SUMMARY OF THE INVENTION

Therefore, an object of the present invention is to provide a liquid phase growth apparatus using the dipping system suitably applicable to mass production using large-area devices such as the solar cells. Further, another object of the present invention is to provide a liquid phase growth method using the dipping system suitably applicable to mass production using large-area devices such as using solar cells.

Thus, present invention provides a liquid phase growth method using a dipping system comprising growing a semiconductor on a plurality using substrates, wherein the semiconductor is liquid-phase grown on the plurality of substrates using a plurality of liquid phase growth chambers.

The growth of the semiconductor on these plural substrates are preferably carried out simultaneously.

Incidentally, the term "simultaneously" as used in the specification and claims means that execution times of the plural operations overlap with each other even a little. In that case, it is preferable that during a period of execution of a certain operation, another operation be started and completed; more preferably, either start times or end times of plural operations or the both are coincident with each other.

Further, the present invention also provides a liquid phase growth method using a dipping system comprising growing a semiconductor on a plurality of substrates, wherein simultaneously with liquid phase growth of the semiconductor on one of the plurality of substrates, another of the plurality of substrates is subjected to annealing.

In addition, the present invention further provides a liquid phase growth method using a dipping system comprising growing a semiconductor on a plurality of substrates, wherein using a liquid phase growth apparatus having a liquid phase growth chamber and an annealing chamber, the semiconductor is liquid-phase grown on one of the plurality of substrates and another of the plurality of substrates is subjected to annealing.

Here, the liquid phase growth on one substrate is preferably carried out simultaneously with the annealing treatment of another substrate.

Further, the present invention also provides a liquid phase growth apparatus of a dipping system for growing a semiconductor on a plurality of substrates, comprising a plurality of liquid phase growth chambers.

In addition, the present invention further provides a liquid phase growth apparatus using a dipping system for growing a semiconductor on a plurality of substrates, comprising a liquid phase growth chamber and an annealing chamber.

These apparatuses preferably have a timing control means for performing time control of at least one of the liquid phase growth operations on the plural substrates, the liquid phase growth in the liquid phase growth chamber and the annealing operation in the annealing chamber, and a dissolving operation of a semiconductor material into a solvent in the liquid phase growth chamber and the annealing operation in the annealing chamber. This timing control means is preferably means for performing such control as to carry out a plurality of operations (liquid phase growth, annealing operation, and dissolving operation) simultaneously.

In the present invention, the aforementioned substrates can be ordinary semiconductor wafers such as Si wafers or GaAs wafers, and the wafers may be either monocrystalline or polycrystalline. The substrates may also be metallurgical-grade Si substrates, ceramic substrates, or metal substrates such as SUS substrates. The liquid-phase grown semiconductors may be either monocrystalline or polycrystalline and materials thereof can be ordinary semiconductors such as Si, GaAs, or Ge. The solvent can be an ordinary metal solvent such as In (indium) or Sn (tin).

The annealing operation in the present invention includes an annealing operation for the purpose of a hydrogen annealing operation, cleaning the substrate, or the like.

The annealing chamber where annealing is executed can be used for vapor deposition by flowing silane ($SiH_4$) gas or the like in the annealing chamber. The liquid phase growth chamber can be used for vapor deposition by flowing silane ($SiH_4$) gas or the like in the liquid phase growth chamber. Therefore, the present invention includes an embodiment that the vapor deposition and liquid phase growth are simultaneously executed.

BRIEF DESCRIPTION OF THE DRAWINGS

FIG. 7 is a timing chart to show a sequence of liquid phase growth in Embodiment 1;

FIG. 14 is a timing chart to show a sequence of liquid phase growth in Embodiment 2;

DESCRIPTION OF THE PREFERRED EMBODIMENTS

The present invention will be described using Embodiments 1 to 5. Embodiment 1 is a preferred embodiment of the liquid phase growth apparatus of a three-vessel type for producing the single-crystal solar cells. Embodiment 2 is a preferred embodiment of the liquid phase growth apparatus of a two-vessel type for producing the single-crystal solar cells. Embodiment 3 is a preferred embodiment of the liquid phase growth apparatus of a five-vessel type for producing the single-crystal solar cells. Embodiment 4 is a preferred embodiment of the liquid phase growth apparatus of the two-vessel type or the five-vessel type for producing the polycrystalline solar cells. Embodiment 5 is a preferred embodiment of the liquid phase growth apparatus of the two-vessel type or the five-vessel type for producing the photosensors. The present invention is not limited only to the embodiments described below, but also involves all combinations of these embodiments.

(Embodiment 1)

Figure 3A:
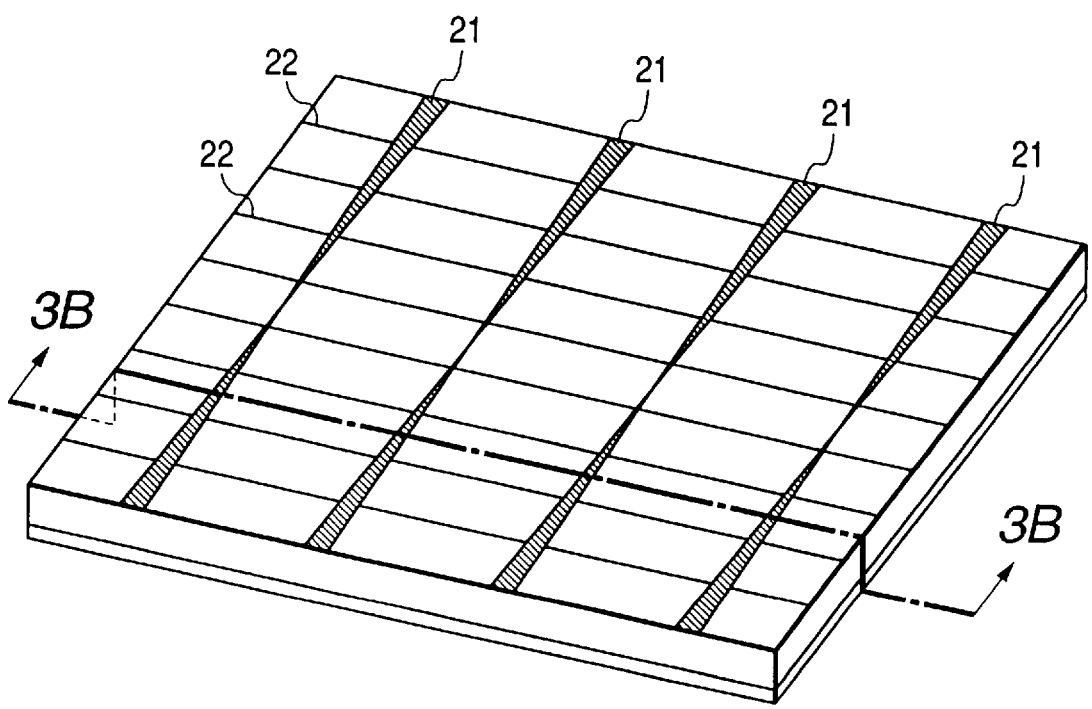
FIG. 3A and FIG. 3B are a perspective view and a sectional view of a single-crystal solar cell produced in Embodiment 1.
Figure 3B:
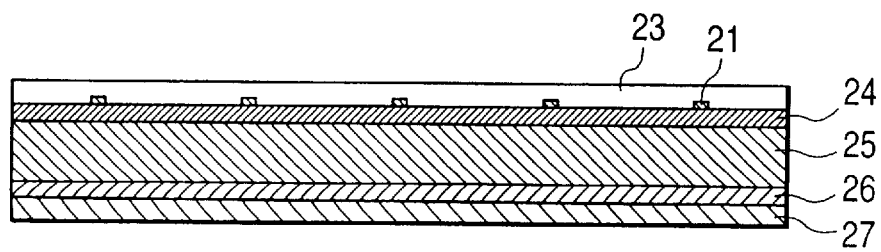

Embodiment 1 is the preferred embodiment of the liquid phase growth apparatus of the three-vessel type for producing the single-crystal solar cells and the liquid phase growth method using it. FIG. 3A and FIG. 3B are a perspective view and a sectional view of the single-crystal solar cell produced in Embodiment 1. FIG. 3B is a sectional view where the solar cell is cut along 3B—3B of the perspective view of FIG. 3A. In the drawings, numeral 21 designates busbars, 22 fingers, 23 an antireflection layer, 24 an $n^-$ Si layer, 25 a $p^-$ Si layer, 26 a $p^+$ Si layer, and 27 a substrate of SUS. The busbars 21 and fingers 22 (which are called grid electrode altogether) constitute a surface electrode to be a cathode. The SUS substrate 27 constitutes a back electrode. Si single crystals of the $n^-$ Si layer 24, the $p^-$ Si layer 25, and the $p^+$ Si layer 26 are formed by liquid phase growth.

Figure 4A:
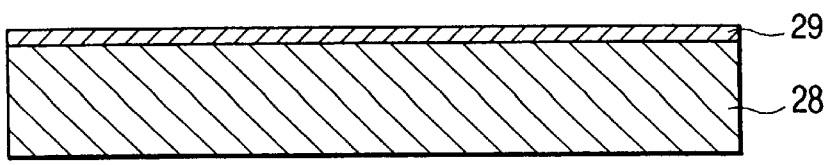
FIG. 4A, FIG. 4B, FIG. 4C, FIG. 4D, and FIG. 4E are sectional views to show production steps of the single-crystal solar cell produced in Embodiment 1.
Figure 4B:
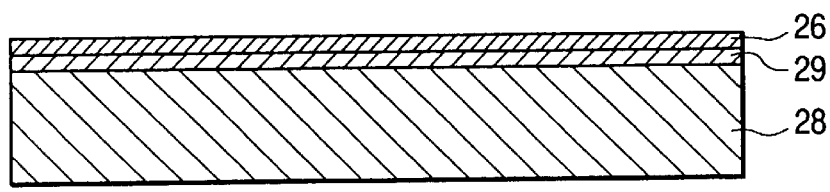
Figure 4C:
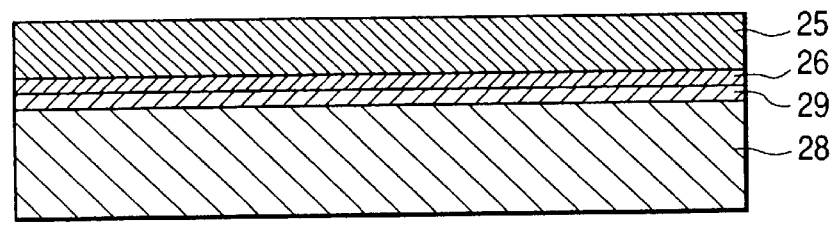
Figure 4D:
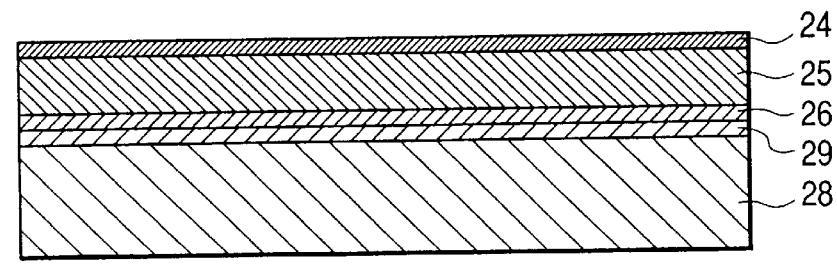
Figure 4E:
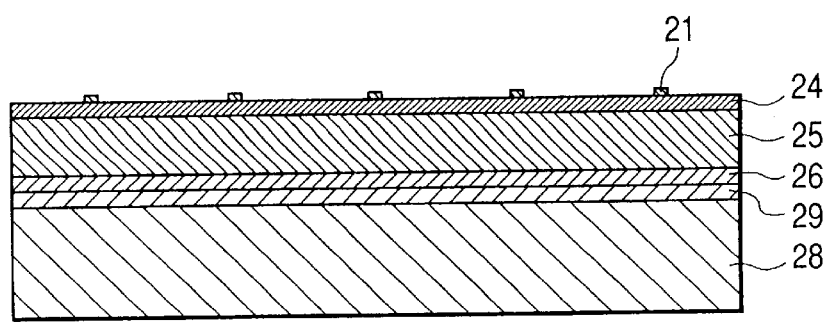
Figure 5A:
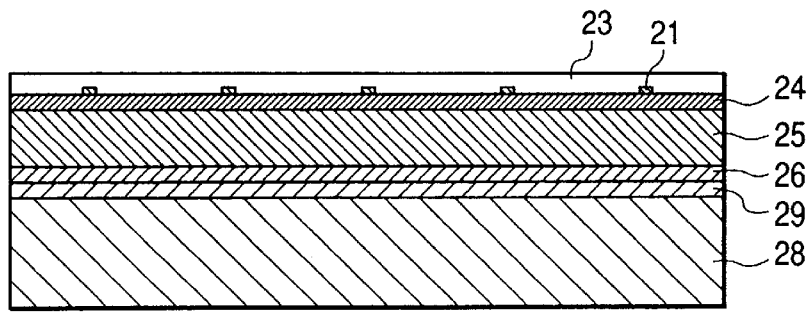
FIG. 5A, FIG. 5B, and FIG. 5C are sectional views to show production steps of the single-crystal solar cell produced in Embodiment 1.
Figure 5B:
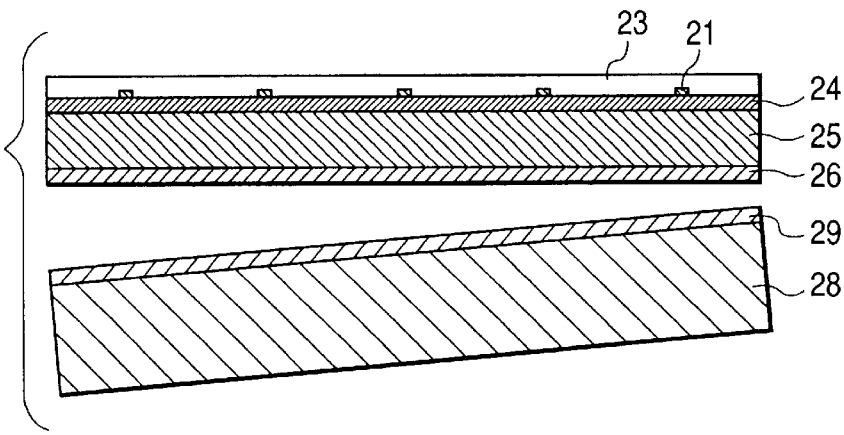
Figure 5C:
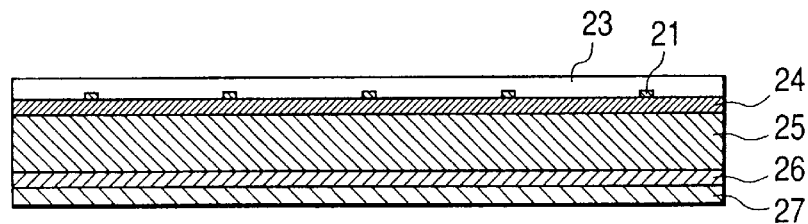
Figure 6A:
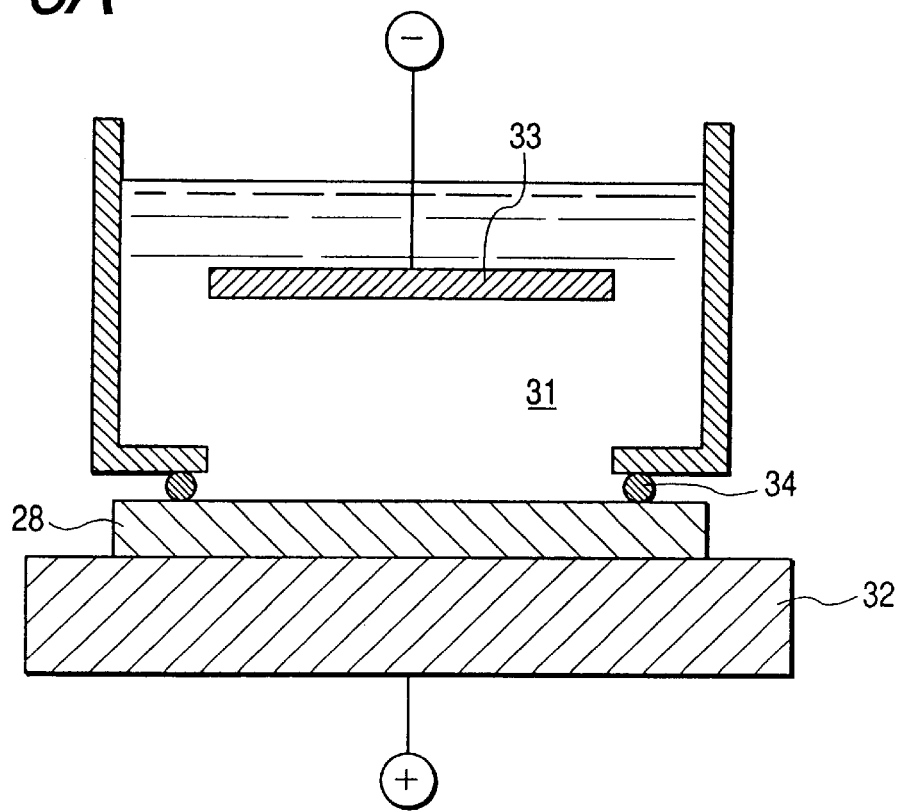
FIG. 6A and FIG. 6B are sectional views of anodization systems in Embodiment 1.
Figure 6B:
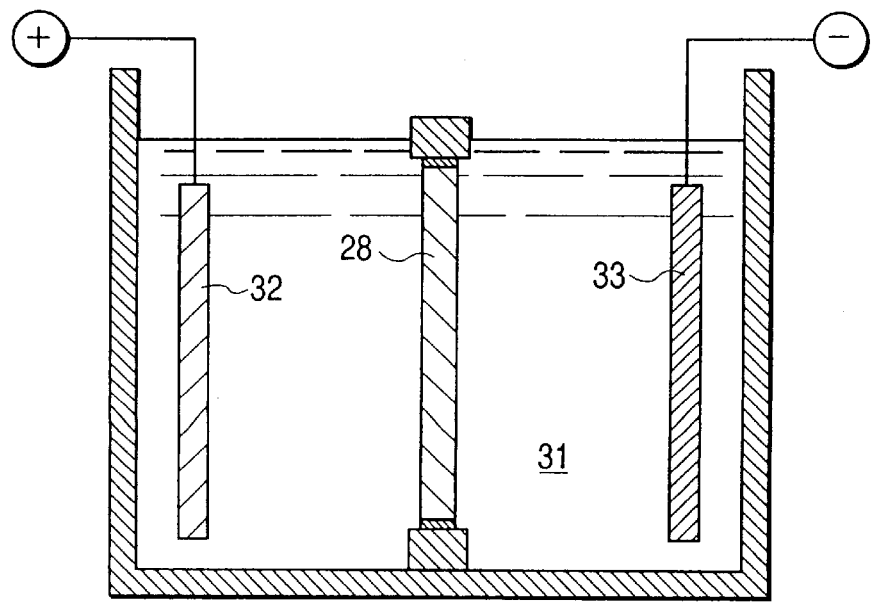
Figure 8:
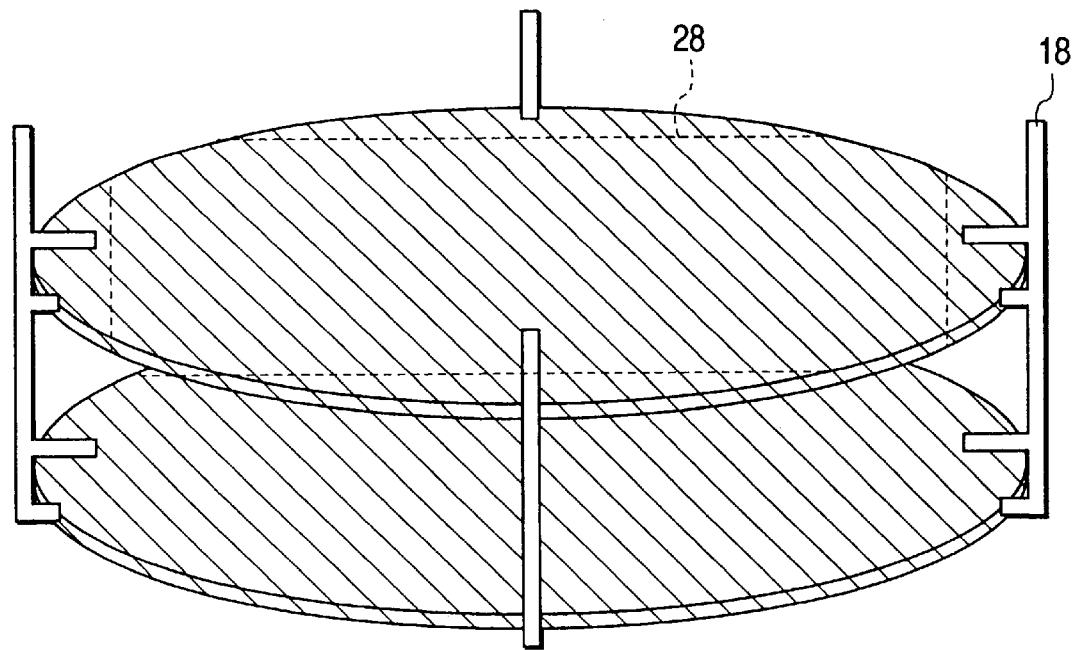
FIG. 8 is a perspective view of a wafer cassette and Si wafers.

FIGS. 4A to 4E and FIGS. 5A to 5C are sectional views to show the production steps of the single-crystal solar cell produced in Embodiment 1. A porous Si layer 29 is first formed in the surface of Si wafer 28, as illustrated in FIG. 4A. The porous Si layer 29 can be formed by anodizing the surface. FIG. 6A and FIG. 6B are sectional views of systems for anodizing the Si wafer in a hydrofluoric acid base etchant. In the figures, numeral 28 denotes the Si wafer, 31 the hydrofluoric acid base etchant, 32, 33 metal electrodes, and 34 and O-ring. The Si wafer 28 to be anodized is desirably of the p-type, but may also be of the n-type if the electric resistance thereof is low. Even in the case of the wafer of the n-type, it can be made porous in a state in which the wafer is exposed to light, so as to generate holes therein. When a voltage is placed between the two electrodes with keeping the lower metal electrode 32 as an anode and the upper metal electrode 33 as a cathode, as illustrated in FIG. 6A, to apply an electric field established by this voltage in the normal direction to the surface of Si wafer 28, the surface of Si wafer 28 opposed to the metal electrode 33 of the cathode becomes porous. In the other system, the metal electrodes 32 and 33 are placed opposite to each other in the etchant and the Si wafer 28 is placed between these opposed electrodes, as illustrated in FIG. 6B. When the voltage is placed between the two electrodes with keeping the metal electrode 32 as an anode and the metal electrode 33 as a cathode to apply the electric field established by this voltage in the normal direction to the surface of Si wafer 28, the surface of Si wafer 28 opposed to the metal electrode 33 of the cathode becomes porous. The hydrofluoric acid base etchant 31 is concentrated hydrofluoric acid (49% HF). Since during the anodization bubbles evolve from the Si wafer 28, alcohol may be added as a surface active agent in some cases in order to efficiently eliminate the bubbles. The alcohol is desirably selected from methanol, ethanol, propanol, and isopropanol. The anodization may also be carried out with agitation using an agitator, instead of using the surface active agent. The thickness of the wafer surface to be porous is preferably 1 to 30 ($\mu$m).

After the porous Si layer 29 is formed on the Si wafer 28 as illustrated in FIG. 4A, by the above step, the single-crystal $p^+$ Si layer 26 is epitaxially grown by liquid phase growth as illustrated in FIG. 4B. The porous Si layer 29 has many pores in the film but maintains the single crystal property. Therefore, the epitaxial growth can take place on the porous Si layer 29. After that, the single-crystal $p^-$ Si layer 25 is also formed by liquid phase growth, as illustrated in FIG. 4C. Then the single-crystal $n^-$ Si layer 24 is formed by liquid phase growth, as illustrated in FIG. 4D. After that, the grid electrodes 21, 22 are formed on the surface of $n^+$ Si layer 24 by such a method as printing, as illustrated in FIG. 4E, and then the antireflection layer 23 is formed on the grid electrodes 21, 22 and the $n^{-60}$ layer 24, as illustrated in FIG. 5A. Then the Si layers 24, 25, 26 to become a solar cell are separated from the Si wafer 28 through the porous Si layer 29, as illustrated in FIG. 5B. The porous Si layer 29 has more fragile structure than the Si wafer 28 and the epitaxially grown Si portions. This allows the single-crystal Si layers 24, 25, 26 to be separated from the Si wafer 28 through the porous Si layer 29 by a method for adhering a tape to the surface of antireflection layer 23 and pulling it to effect the separation, a method for applying a water jet to the side, and so on. Then the SUS substrate 27 is attached to the bottom surface of $p^-$ Si layer 26, as illustrated in FIG. 5C, thereby completing a unit cell of solar cell. The Si wafer 28 used in the above process can be used again after the residue of the porous layer is removed by etching or the like and then the wafer surface is cleaned.

Figure 1:
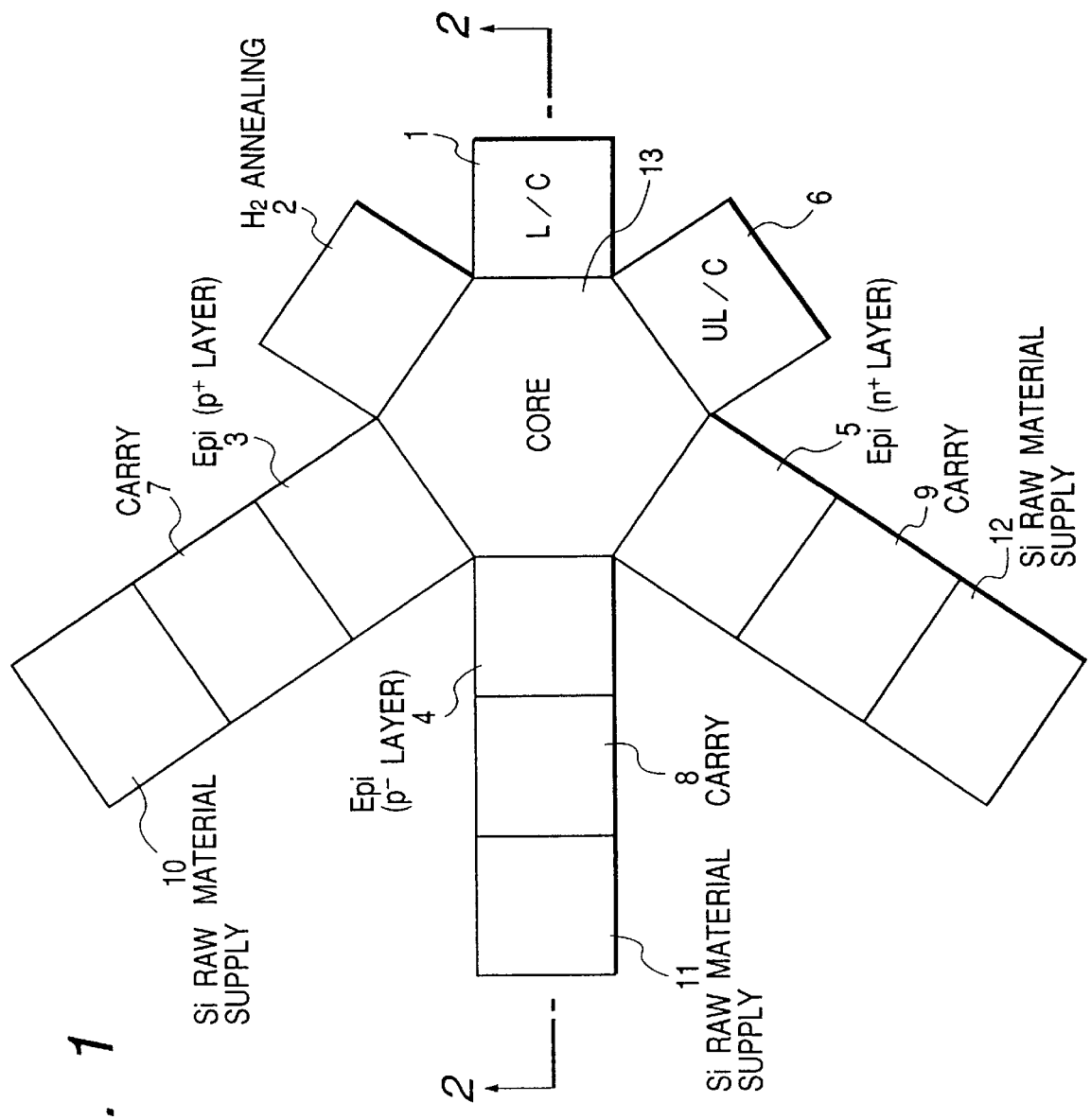
FIG. 1 is a top plan view of the liquid phase growth apparatus of (Embodiment 1.
Figure 2:
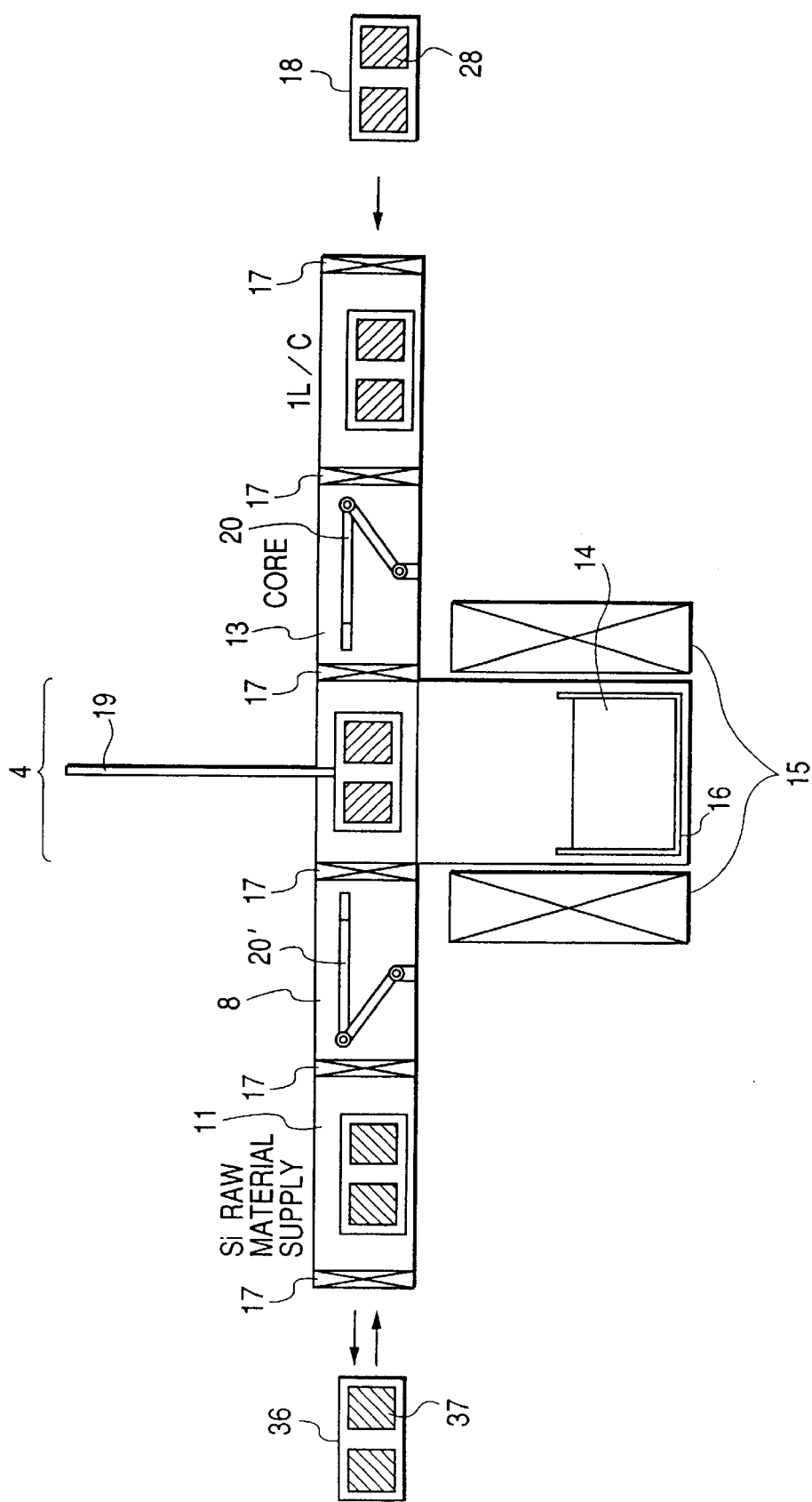
FIG. 2 is a sectional view of the liquid phase growth apparatus of Embodiment 1.

FIG. 1 and FIG. 2 are a top plan view and a sectional view of the liquid phase growth apparatus of the three-vessel type for producing the solar cells. In the figure, numeral 1 indicates a loading chamber (L/C), 2 a hydrogen annealing chamber, 3 a growth chamber of $p^-$ Si layer 26, 4 a growth chamber of $p^-$ Si layer 25, 5 a growth chamber of $n^-$ Si layer 24, 6 an unloading chamber (UL/C), and 13 a core in which a carrying system of a substrate cassette is installed. Numerals 7, 8, 9 represent carry chambers for supplying the Si source to the growth chamber for the $p^-$ Si layer, the $p^-$ Si layer, or the $n^+$ Si layer, respectively, and numerals 10, 11, 12 supply chambers of Si source for the growth chambers of the $p^+$ Si layer, $p^-$ Si layer, and $n^+$ Si layer, respectively.

First, the substrate cassette 18 carrying the Si wafer 28 with the porous Si layer 29 in the surface thereof is put into the loading chamber (L/C) 1. Then, using the carrying system located in the core 13, the substrate cassette in the loading chamber (L/C) 1 is moved into the hydrogen annealing chamber 2 to carry out hydrogen annealing. After that, the substrate cassette is transferred to the growth chamber 3 of $p^+$ Si layer 26, to the growth chamber 4 of $p^-$ Si layer 25, and to the growth chamber 5 of $n^-$ Si layer 24 in order, thereby forming the $p^-$ Si layer 26, the $p^{-60}$ Si layer 25, and the $n^+$ Si layer 24 in this order on the surface of the porous Si layer 29, as illustrated in FIGS. 4B to 4D.

FIG. 2 is a sectional view of the apparatus cut along the line 2—2 of FIG. 1. In the figure, numeral 14 denotes a solvent, 15 a heater, 16 a crucible, 18 the wafer cassette, 19 a system for carrying in the vertical direction, 20 a system for carrying in the horizontal direction, 36 a source substrate cassette, and 37 a source substrate. The reference symbols stated previously denote the same components as before and the description thereof is omitted herein. The loading chamber 1 is usually isolated from the core 13 and the external atmosphere by gate valves 17. When the gate valve 17 on the external atmosphere side of the loading chamber 1 is opened, the wafer cassette 18 can be guided into the loading chamber 1; when the gate valve on the side of the loading chamber 1 adjacent to the core 13 is opened, the wafer cassette 18 can be guided into the core 13. Further, using the horizontal carrying system 20 in the core 13, the wafer cassette 18 can be moved into the growth chamber 4 of $p^-$ Si layer.

When the gate valve 17 on the external atmosphere side of the Si source supply chamber 11 is opened, the source substrate cassette 36 can be carried into or out of the supply chamber 11. When the gate valve 17 adjacent to the carry chamber 8 is opened, the source substrate cassette 36 can be moved into the growth chamber 4 of $p^-$ Si layer by use of the horizontal carry system 20' located in the carry chamber 8. The wafer cassette 18 or the source substrate cassette 36 can be moved up and down in the vertical direction by using the vertical carry system 19 located in the growth chamber 4 of p⁻ Si layer. Therefore, the vertical carry system 19 can carry the wafer cassette 18 and the source substrate cassette 36 into the solvent 14 stored in the crucible 16. The heater 15 heats the solvent 14 and crucible 16, thereby keeping the solvent 14 in a liquid state. A sectional view of the growth chamber 3 of p⁺ Si layer, the carry chamber 7, and the Si source supply chamber 10 and a sectional view of the growth chamber 5 of n⁺ Si layer, the carry chamber 9, and the Si source supply chamber 12 are also similar to FIG. 2.

FIG. 7 is a time chart to show the sequence of the operation of the liquid phase growth apparatus shown in FIG. 1 and FIG. 2. Letter "A" indicates movement of the wafer cassette of the first batch. The wafer cassette 18 of the first batch is loaded in the loading chamber 1 in first 20 minutes. Then the wafer cassette is conveyed to the hydrogen annealing chamber 2. In the hydrogen annealing chamber 2, the temperature of the wafer cassette 18 is increased in 30 minutes and hydrogen annealing is carried out for 10 minutes. The hydrogen annealing is performed at about 1040° C. in a hydrogen atmosphere. A small amount of SiH₄ (silane) gas may be allowed to flow immediately after the hydrogen annealing, so as to improve the surface property of the porous Si layer 29.

During the period of the increase of the temperature of the wafer cassette 18 and the hydrogen annealing operation, the source substrate cassette 36 retaining p⁺ Si in the wafer shape or the like is conveyed from the Si source supply chamber 10 through the carry chamber 7 into the growth chamber 3 and is dipped into the melt kept at high temperature, whereby p⁻ Si is melted (dissolved) into the melt for 20 minutes. The melt can be In or Sn or the like.

Next, the wafer cassette 18 is moved into the growth chamber 3 of p⁻ Si layer by use of the horizontal carry system 20. In the growth chamber 3 of p⁺ Si layer, the wafer cassette 18 is held for 10 minutes before the wafer cassette 18 reaches the temperature of the liquid phase growth. During this period the solvent is cooled by controlling the heater, so that p⁻ Si goes into a supersaturated state.

Then the wafer cassette 18 is dipped into the solvent by the vertical carry system of the growth chamber 3, and the temperature of the solvent is slowly decreased, whereupon the p⁺ Si layer 26 of single crystal is epitaxially grown on the surface of the porous Si layer 29. The time period of this growth is about 10 minutes.

During the period of the adjustment of the substrate temperature of the wafer cassette 18 and the growth of p⁺ Si layer 26 in the growth chamber 3 of p⁺ Si layer, the source substrate cassette 36 retaining p⁻ Si in the wafer shape or the like is carried from the Si source supply chamber 11 through the carry chamber 8 into the growth chamber 4 and is dipped into the solvent 14 kept at high temperature, whereby p⁻ Si is dissolved into the solvent 14 for 20 minutes. The solvent can be In or Sn or the like.

Then the wafer cassette 18 is moved into the growth chamber 4 of p⁻ Si layer, using the horizontal carry system 20. In the growth chamber 4 of p⁻⁶⁰ Si layer, the wafer cassette 18 is held for ten minutes before the wafer cassette 18 reaches the temperature of liquid phase growth. During this period the solvent 14 is cooled by controlling the heater 15, so that p⁻ Si goes into the supersaturated state.

Then the wafer cassette 18 is dipped into the solvent 14 by use of the vertical carry system 19 in the growth chamber 4 of p⁻ Si layer, and the temperature of solvent 14 is slowly decreased, whereupon the p⁻ Si layer 25 of single crystal is epitaxially grown on the surface of p⁺ Si layer 26. The period of this growth is about 30 minutes. During this dipping time the p⁻⁶⁰ Si layer 25 is grown in the thickness of about 30 (μm).

During the period of the adjustment of the substrate temperature of the wafer cassette 18 and the growth of the p⁻ Si layer 25 in the growth chamber 4 of p⁻ Si layer, the source substrate cassette retaining n⁺ Si in the wafer shape or the like is moved from the Si source supply chamber 12 through the carry chamber 9 into the growth chamber 5 and is dipped into the solvent kept at high temperature, whereby n⁺ Si is dissolved into the melt for 20 minutes. The solvent can be In or Sn or the like.

Next, the wafer cassette 18 is moved into the growth chamber 5 of n⁻ Si layer by use of the horizontal carry system. In the growth chamber 5 of n⁻ Si layer, the wafer cassette 18 is held for 10 minutes before the wafer cassette 18 reaches the temperature of liquid phase growth. During this period the melt is cooled by controlling the heater, so that n⁺ Si goes into the supersaturated state.

Then the wafer cassette 18 is dipped into the solvent by use of the vertical carry system in the growth chamber 5 of n⁺ Si layer, and the temperature of the solvent is slowly decreased, whereupon the n⁺ Si layer 24 of single crystal is epitaxially grown on the surface of p⁻ Si layer 25. The period of this growth is about 10 minutes.

After that, the wafer cassette 18 is drawn up out of the solvent and moved to the unloading chamber 6 to be cooled for 55 minutes, thereby decreasing the temperature of the wafer cassette 18 to room temperature. The wafer cassette 18 is taken out of the liquid phase growth apparatus in last 5 minutes. Letter "B" represents movement of the wafer cassette of the second batch. The wafer cassette of the second batch is also moved according to the time chart of FIG. 7. The movement of the wafer cassette of the second batch is similar to that of the wafer cassette of the first batch. The liquid phase growth apparatus of Embodiment 1 can perform the liquid phase growth of one batch every 60 minutes.

In the liquid phase growth apparatus of Embodiment 1, the liquid phase growth in the chamber 3 for growing the p⁺ Si layer is carried out simultaneously with that in the chamber 5 for growing the n⁺ Si layer, as seen in 130 to 140 minutes in the time chart illustrated in FIG. 7. In addition, the annealing operation in the hydrogen annealing chamber 2 is also carried out simultaneously with the liquid phase growth in the chamber 4 for growing the p⁻ Si layer, as seen in 110 to 120 minutes in the time chart illustrated in FIG. 7. Further, the annealing operation in the hydrogen annealing chamber 2 is also carried out simultaneously with the dissolving operation of the semiconductor material into the melt in the chamber 3 for growing the p⁺ Si layer, as seen in 50 to 60 minutes of FIG. 7.

The times control described above is performed by time control means provided in the liquid phase growth apparatus of the present invention.

In the above description, Embodiment 1 was described as an example for forming the multiple epitaxial Si layers on the porous Si layer. However, the epitaxial Si layers may also be formed on the Si wafer itself, or on an ordinary Si substrate such as a polycrystalline Si substrate or a metallurgical-grade Si substrate, instead of the porous Si layer. The semiconductors such as polycrystalline semiconductors may also be epitaxially grown with the liquid phase growth on an ordinary semiconductor substrate such as GaAs or on a ceramic substrate, instead of the porous Si layer. The hydrogen annealing chamber 2 may also be used for an annealing operation for the purpose of cleaning of the substrate, without being limited to the annealing operation in the hydrogen ambience.

Embodiment 1 permits the solar cells of thin film single-crystal Si with high conversion efficiency and with less degradation to be provided at low watt cost.

(Embodiment 2)

Figure 11A:
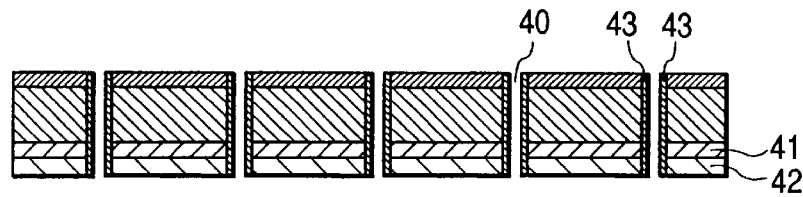
FIG. 11A, FIG. 11B, FIG. 11C, and FIG. 11D are sectional views to show production steps of the solar cell in Embodiment 2.
Figure 11B:
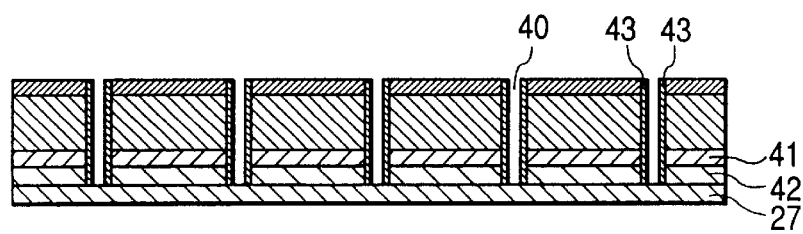
Figure 11C:
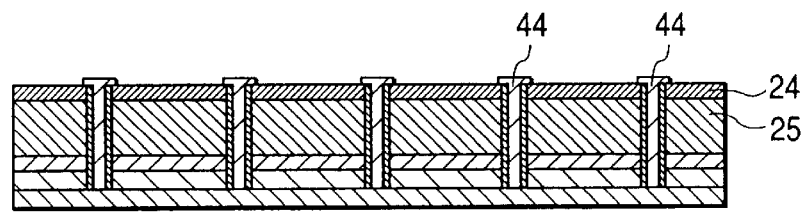
Figure 11D:
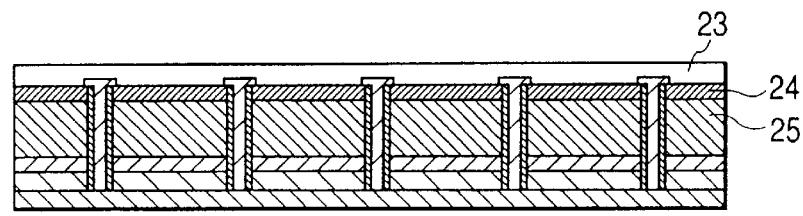
Figure 12:
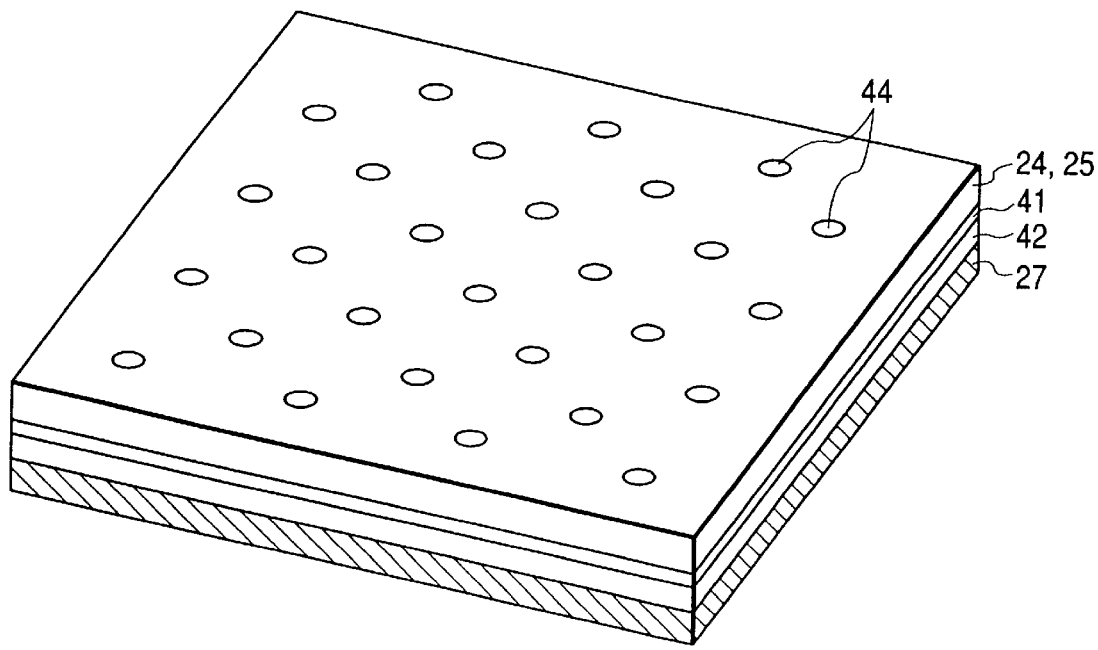
FIG. 12 is a perspective view of the solar cell in Embodiment 2.
Figure 13:
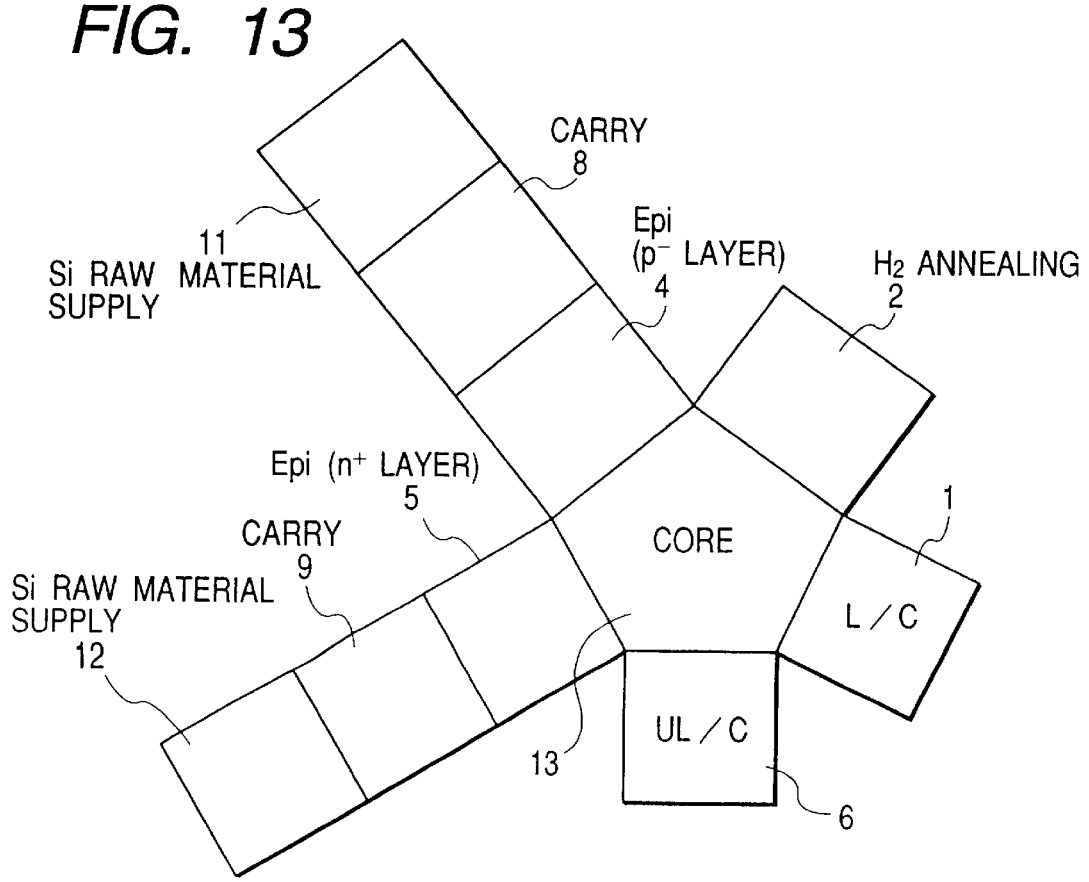
FIG. 13 is a top plan view of the liquid phase growth apparatus of Embodiment 2.

Embodiment 2 is the preferred embodiment of the liquid phase growth apparatus of the two-vessel type for producing the single-crystal solar cells and the liquid phase growth method using it. In the solar cell of Embodiment 2, electrodes are formed using through-holes. FIGS. 9A to 9D, FIGS. 10A to 10E, and FIGS. 11A to 11D show the production steps of the solar cell in Embodiment 2 and FIG. 12 is a perspective view of the solar cell of Embodiment 2. FIG. 13 is a top plan view of the liquid phase growth apparatus of Embodiment 2. In the figures, numeral 41 denotes an Al electrode, 42 an insulating sheet, 43 insulating regions, and 44 through-hole electrodes. The other reference numerals denote the same components as those described above. The through-hole electrodes 44 of FIG. 12 have the function to transfer conductive electrons floating in the $n^+$ Si layer 24 to the SUS substrate 27 of the cathode. The Al electrode 41 and the $p^-$ Si layer 25 are connected to each other by baking, so that the junction between them becomes a $p^-$ Si layer. During operation as a solar cell, electrons from the Al electrode 41 of the anode are supplied to holes floating in the $p^-$ Si layer.

Figure 9A:
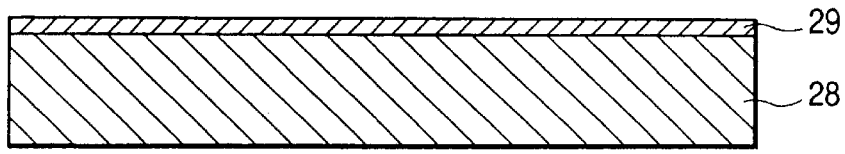
FIG. 9A, FIG. 9B, FIG. 9C, and FIG. 9D are sectional views to show production steps of the solar cell in Embodiment 2.
Figure 9B:
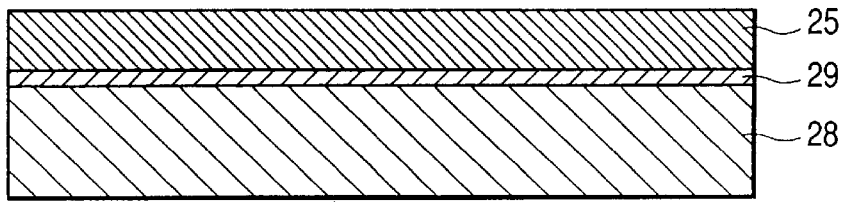
Figure 9C:
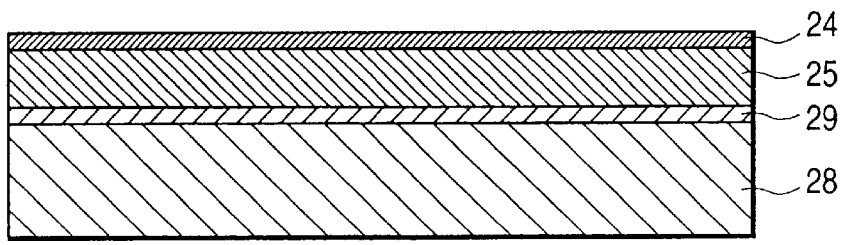

The production steps of the solar cell of Embodiment 2 will be described. First, the porous Si layer 29 is formed on Si wafer 28, as illustrated in FIG. 9A. The forming method of the porous Si layer 29 is similar to that in Embodiment 1. Next, the $p^-$ Si layer 25 of single crystal is formed on the porous Si layer 29, as illustrated in FIG. 9B. Then the $n^+$ Si layer 24 of single crystal is formed on the $p^-$ Si layer 25 of single crystal, as illustrated in FIG. 9C. The steps of forming these $p^-$ Si layer 25 and $n^+$ Si layer 24 are carried out using the liquid phase growth apparatus of the two-vessel type as illustrated in FIG. 13. A sectional view of the growth chamber 4 of $p^-$ Si layer, the carry chamber 8, the Si source supply chamber 11, the growth chamber 5 of $n^+$ Si layer, the carry chamber 9, and the Si source supply chamber 12 is similar to FIG. 2.

FIG. 14 is a time chart to show the sequence of the steps of forming the $p^-$ Si layer 25 and $n^+$ Si layer 24. Letter "A" represents movement of the wafer cassette of the first batch. The wafer cassette of the first batch is loaded in the loading chamber 1 in first 20 minutes. Then the wafer cassette is carried into the hydrogen annealing chamber 2. In the hydrogen annealing chamber 2 the temperature of the wafer cassette is increased in 30 minutes and hydrogen annealing is carried out for 10 minutes. The hydrogen annealing is carried out at about 1040° C. in the hydrogen atmosphere.

During the period of the increase of temperature of the wafer cassette and the hydrogen annealing operation, the source substrate cassette retaining $p^-$ Si in the wafer shape or the like is carried from the Si source supply chamber 11 through the carry chamber 8 into the growth chamber 4 and is dipped into the solvent kept at high temperature, whereby $p^-$ Si is dissolved into the solvent for 20 minutes. The solvent can be In or Sn or the like.

Then the wafer cassette is moved into the growth chamber 4 of $p^-$ Si layer, using the horizontal carry system. In the growth chamber 4 of $p^-$ Si layer the wafer cassette is held for 10 minutes before the wafer cassette reaches the liquid phase growth temperature. During this period the solvent is cooled by controlling the heater, so that $p^-$ Si goes into the supersaturated state.

Then the wafer cassette is dipped into the solvent, using the vertical carry system in the growth chamber 4 of $p^-$ Si layer and the temperature of the solvent is slowly decreased, whereupon the $p^-$ Si layer 25 of single crystal is epitaxially grown on the surfaces of the porous Si layer 29. This growth time period is approximately 30 minutes. During this dipping period the $p^-$ Si layer 25 is grown in the thickness of about 30 ($\mu$m), as illustrated in FIG. 9B.

During the period of the adjustment of the substrate temperature of the wafer cassette 18 and the growth of the $p^-$ Si layer 25 in the growth chamber 4 of $p^-$ Si layer, the source substrate cassette retaining $n^+$ Si in the wafer shape or the like is carried from the Si source supply chamber 12 through the carry chamber 9 into the growth chamber 5 and is dipped into the solvent kept at high temperature, whereby $n^+$ Si is dissolved into the solvent for 20 minutes. The solvent can be In or Sn or the like.

Then the wafer cassette in moved into the growth chamber 5 of $n^+$ Si layer, using the horizontal carry system. In the growth chamber 5 of $n^+$ Si layer, the wafer cassette is held for 10 minutes before the wafer cassette reaches the liquid phase growth temperature. During this period the solvent is cooled by controlling the heater, so that $n^+$ Si goes into the supersaturated state.

Then the wafer cassette is dipped into the solvent, using the vertical carry system in the growth chamber 5 of $n^+$ Si layer and the temperature of the solvent is slowly decreased, so that the $n^+$ Si layer 24 of single crystal is epitaxially grown on the surface of $p^-$ Si layer 25, as illustrated in FIG. 9C. This growth period is about 10 minutes.

After that, the wafer cassette is moved from the growth chamber 5 of $n^+$ Si layer into the unloading chamber 6, using the horizontal carry system of core 13. Then the wafer cassette is cooled for 55 minutes. to return the temperature of the wafer cassette to room temperature. The wafer cassette is taken out in last 5 minutes. Letter "B" in FIG. 14 represents movement of the wafer cassette of the second batch. The movement of the wafer cassette of the second batch is similar to that of the wafer cassette of the first batch. The liquid phase growth apparatus of Embodiment 2 can perform the liquid phase growth of one batch every 60 minutes. The time control as described above is carried out by timing control means provided in the liquid phase growth apparatus of the present invention.

Figure 9D:
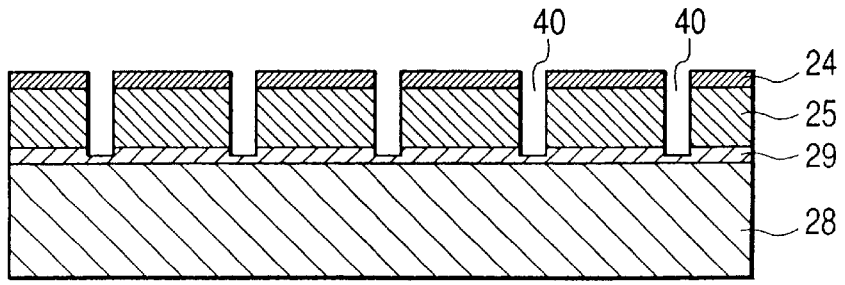
Figure 10A:
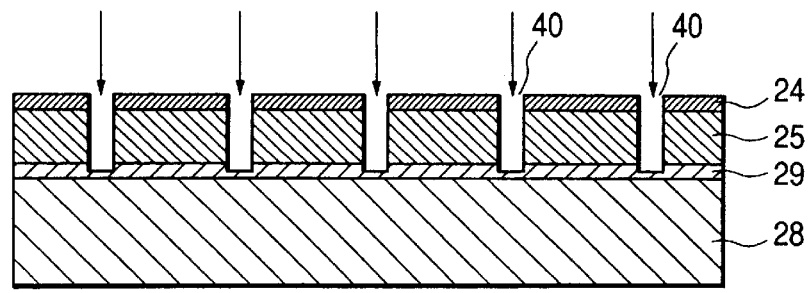
FIG. 10A, FIG. 10B, FIG. 10C, FIG. 10D, and FIG. 10E are sectional views to show production steps of the solar cell in Embodiment 2.
Figure 10B:
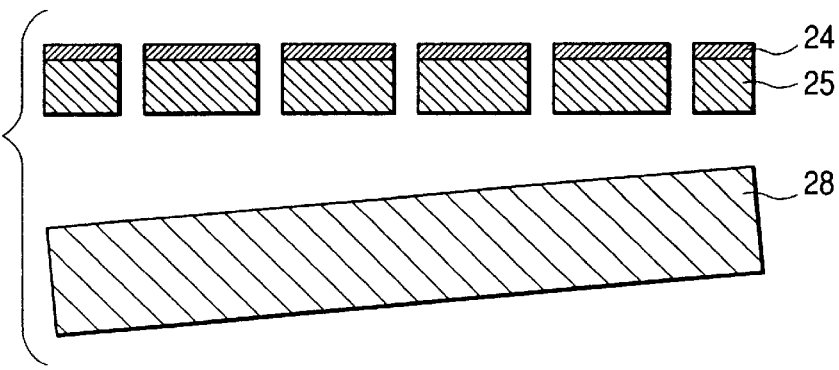

After completion of the growth of the epitaxial Si layers 24, 25 as described above, the surface of the $n^+$ Si layer 24 is exposed to a laser, as illustrated in FIG. 9D, so as to bore holes through the epitaxial Si layers 24, 25, thereby forming the through-holes 40 and exposing the porous Si layer 29. Then the substrate illustrated in FIG. 9D is dipped in a wet etching solution. The wet etching solution is preferably a mixed solution of hydrofluoric acid with hydrogen peroxide, for example. On that occasion, the wet etching solution permeates through the through-holes 40 as indicated by arrows in FIG. 10A, so as to selectively etch the porous Si layer 29. Now, the epitaxial Si layers 24, 25 can be separated from the Si wafer 28, as illustrated in FIG. 10B. The Si wafer 28 used in the above process can be reused after the residue of the porous layer is removed by etching or the like and then the wafer surface is cleaned. Approximately one hundred epitaxial Si layers 24, 25 can be produced from one Si wafer as so reused.

Figure 10C:
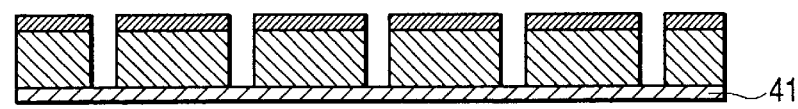
Figure 10D:
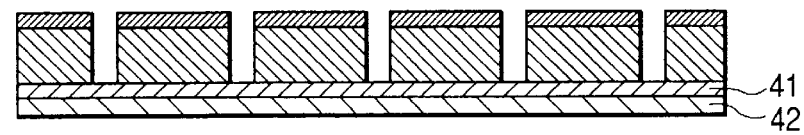
Figure 10E:
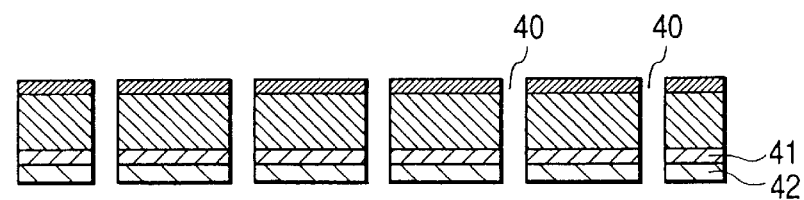

After that, an A1 sheet, which will become the A1 electrode 41, is attached to the bottom surface of the p⁻ Si layer 25, as illustrated in FIG. 10C. Then the insulating sheet 42 is attached in contact with the A1 electrode 41 to the back thereof, as illustrated in FIG. 10D. The laser is positioned as the through-holes 40 and is radiated again thereto, thereby boring holes in the A1 electrode 41 and insulating sheet 42. Next, the insulating region 43 is formed on the wall surface of each through-hole 40, as illustrated in FIG. 11A. This insulating region 43 can be formed in such a manner that each through-hole 40 is filled with an insulating material and thereafter the laser is positioned at the through-hole 40 to be radiated thereto, so as to bore a hole in the insulating material. Then the SUS substrate 27 is attached in contact with the insulating sheet 42 thereto, as illustrated in FIG. 11B. Then the through-hole electrodes 44 are formed as illustrated in FIG. 11C. The through-hole electrodes 44 are formed by a method for filling the through-holes 40 with a C (carbon) paste or the like, a method of dotting, or the like. Then the surface of the n⁺ Si layer 24 is coated by the antireflection film 23, for example, of $TiO_2$ as illustrated in FIG. 11D, thus completing the solar cell.

In the liquid phase growth apparatus of Embodiment 2, the annealing operation in the hydrogen annealing chamber 2 is carried out simultaneously with the liquid phase growth of the n⁺ Si layer in the growth chamber 5 of n⁺ Si layer, as seen in 110 to 120 minutes in the time chart of FIG. 14. Further, the annealing operation in the hydrogen annealing chamber 2 is also carried out simultaneously with the dissolving operation of the semiconductor material in the growth chamber 4 of p⁻ Si layer, as seen in 50 to 60 minutes in the time chart of FIG. 14.

Embodiment 2 permits production of the solar cell using the through-hole electrodes as contact electrodes, i.e., production of the solar cell with little shadow loss and with high photoelectric conversion efficiency.

(Embodiment 3)

Figure 15:
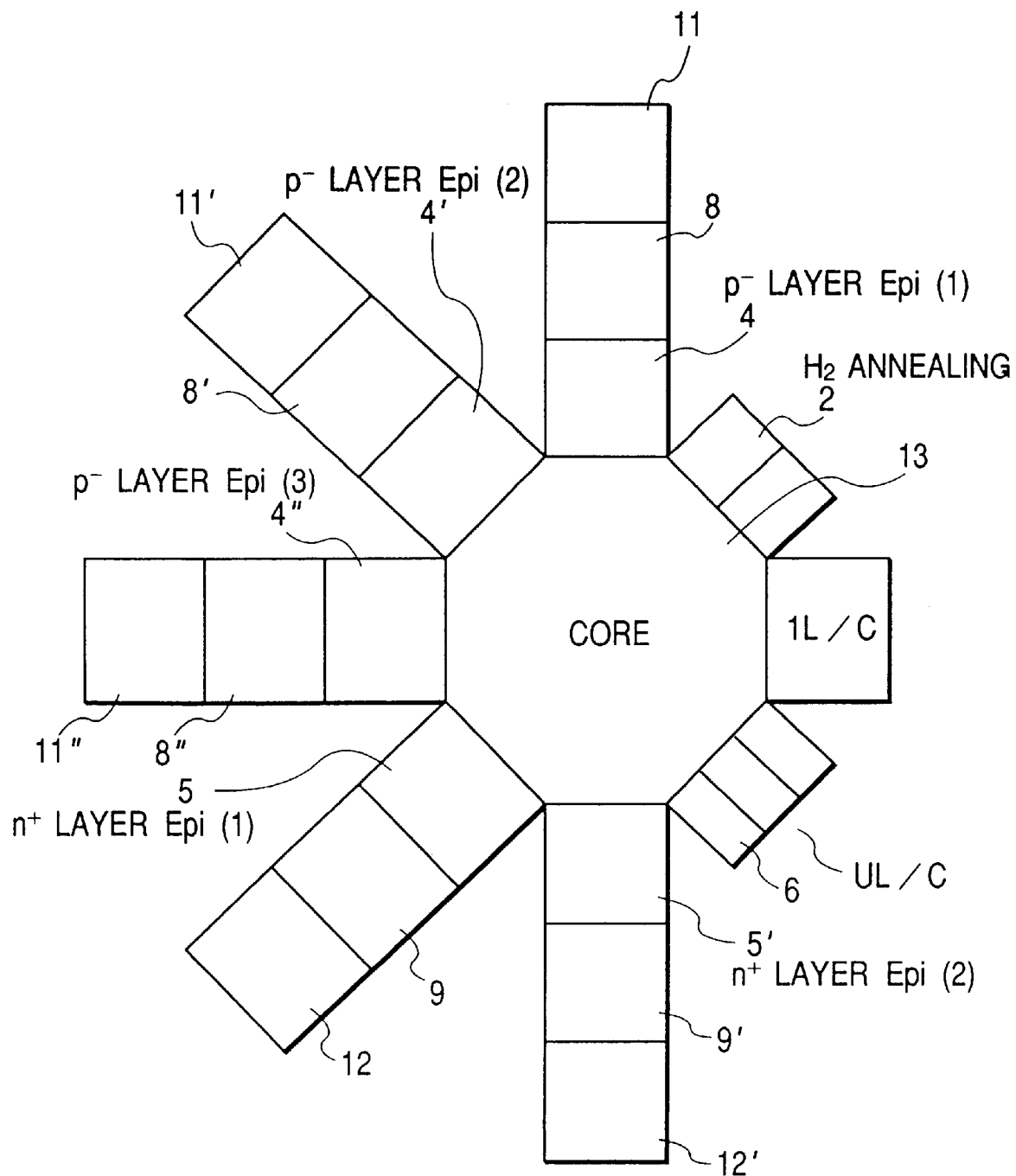
FIG. 15 is a top plan view of the liquid phase growth apparatus of Embodiment 3.
Figure 16B:
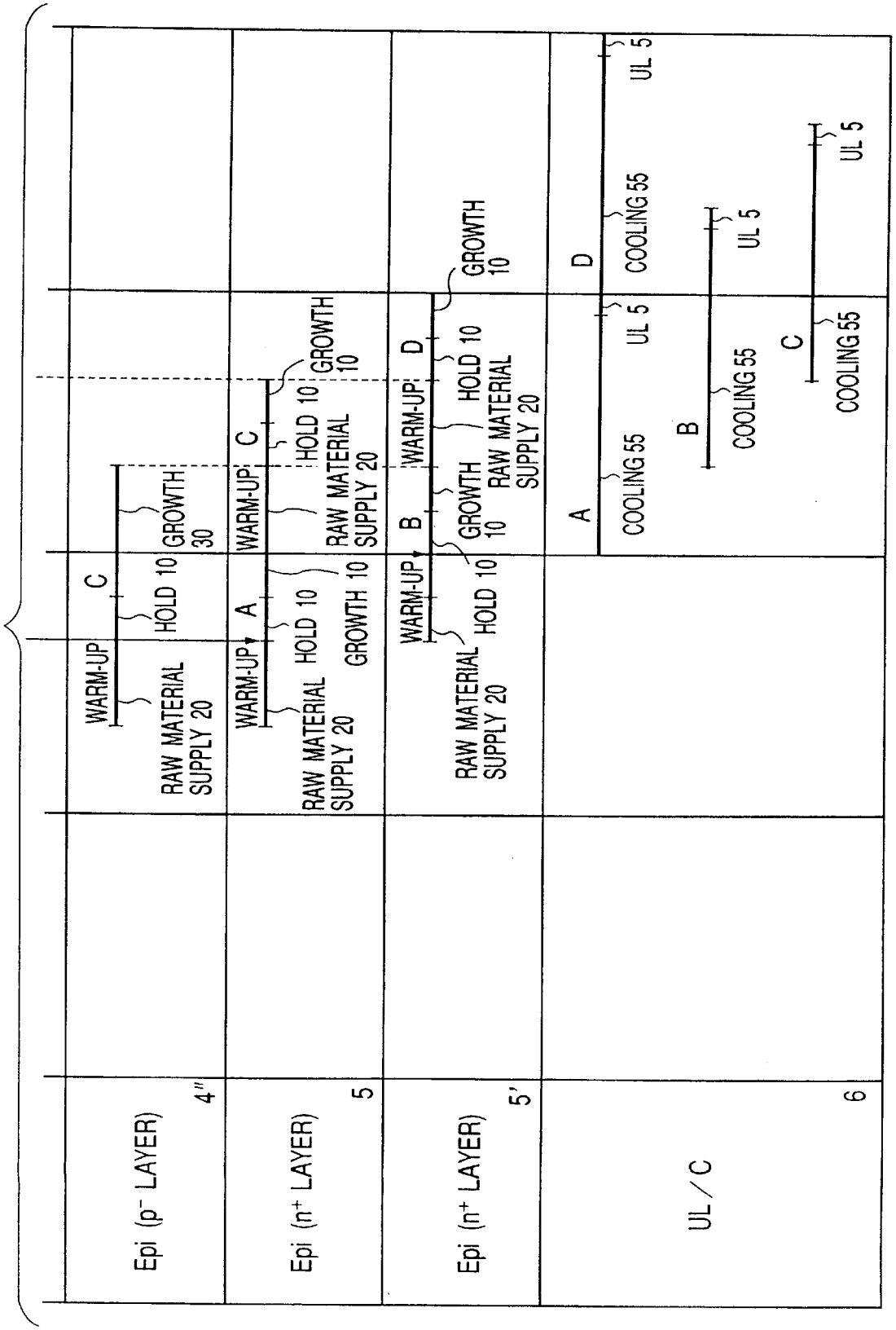
FIG. 16 which is comprised of FIGS. 16A and 16B, is a timing chart to show a sequence of liquid phase growth in Embodiment 3.

Embodiment 3 is the preferred embodiment of the liquid phase growth apparatus of the five-vessel type for producing the single-crystal solar cells and the liquid phase growth method using it. The production method and structure of the solar cell of Embodiment 3 are the same as those of the solar cell of Embodiment 2 illustrated in FIGS. 9A to 9D and FIG. 10 to FIG. 12. FIG. 15 is a plan view where the liquid phase growth apparatus of Embodiment 3 is observed from above. FIGS. 16A to 16B are time charts of the sequence of the operation of the liquid phase growth apparatus shown in FIG. 15. The liquid phase growth apparatus of Embodiment 3 has five vessels of liquid phase growth chambers, among which three vessels are growth chambers of p⁻ Si layer and two vessels are growth chambers of n⁺ Si layer. In FIG. 15, numerals 4, 4', 4" all represent the growth chambers of p⁻ Si layer, to each of which a carry chamber 8, 8', or 8" and an Si source supply chamber 11, 11' or 11" are adjacent. Numerals 5, 5' represent the growth chambers of n⁺ Si layer, to each of which a carry chamber 9 or 9' and an Si source supply chamber 12 or 12' are adjacent. Numeral 1 denotes the loading chamber. Numeral 2 designates the hydrogen annealing chamber which has two rooms. Numeral 6 represents the unloading chamber which has three rooms. Numeral 13 indicates the core. A carry system is located inside the core 13 and the wafer cassette can be carried into a room adjacent to the core 13 by the carry system.

First, the porous Si layer 29 is formed on the Si wafer 28, as illustrated in FIG. 9A, by the anodization method described in Embodiment 1. Next, the single-crystal p⁻ Si layer 25 is formed on the porous Si layer 29, as illustrated in FIG. 9B, by use of the liquid phase growth apparatus of the five-vessel type illustrated in FIG. 15. Then the single-crystal n⁺ Si layer 24 is formed on the p⁻ Si layer 25, as illustrated in FIG. 9C. A sectional view of the growth chambers 4, 4', 4" of p⁻ Si layer, the carry chambers 8, 8', 8", the Si source supply chambers 11, 11', 11", the growth chambers 5, 5' of n⁺ Si layer, the carry chambers 9, 9', and the Si source supply chambers 12, 12' is similar to FIG. 2.

FIGS. 16A and 16B are time charts to show the sequence of the steps of forming the p⁻ Si layer 25 and n⁺0 Si layer 24. Letter "A" represents the movement of the wafer cassette of the first batch. The wafer cassette of the first batch is loaded in the loading chamber 1 in first 20 minutes. Then the wafer cassette is carried into the hydrogen annealing chamber 2. In the hydrogen annealing chamber 2, the temperature of the wafer cassette is increased in next 30 minutes and hydrogen annealing is carried out for 10 minutes. The hydrogen annealing is carried out at about 1040° C. in the hydrogen atmosphere.

During the period of the temperature increase of the wafer cassette and the hydrogen annealing, the source substrate cassette retaining p⁻ Si in the wafer shape or the like is carried from the Si source supply chamber 11 through the carry chamber 8 into the growth chamber 4 and is dipped into the solvent kept at high temperature, whereby p⁻ Si is dissolved into the solvent for 20 minutes. The solvent can be In or Sn or the like.

Then the wafer cassette is moved from the hydrogen annealing chamber 2 into the growth chamber 4 of p⁻ Si layer, using the horizontal carry system. In the growth chamber 4 of p⁻ Si layer, the wafer cassette is held for 10 minutes before the wafer cassette reaches the liquid phase growth temperature. During this period the solvent is cooled by controlling the heater, whereby p⁻ Si goes into the supersaturated state.

Then the wafer cassette is into the solvent using the vertical carry system dipped in the growth chamber 4 of p⁻ Si layer and the temperature of the solvent is slowly decreased, whereupon the single-crystal p⁻ Si layer 25 is epitaxially grown on the surface of the porous Si layer 29. This growth period is approximately 30 minutes. During this dipping period, the p⁻ Si layer 25 is grown in the thickness of about 30 ($\mu$m), as illustrated in FIG. 9B.

During the period of the adjustment of the substrate temperature of the wafer cassette 18 and the growth of the p⁻ Si layer 25 in the growth chamber 4 of p⁻ Si layer, the source substrate cassette retaining n⁺ Si in the wafer shape or the like is moved from the Si source supply chamber 12 through the carry chamber 9 into the growth chamber 5 and is dipped into the solvent kept at high temperature, whereby n⁺ Si is dissolved into the solvent for 20 minutes. The solvent can be In or Sn or the like.

Then the wafer cassette is moved into the growth chamber 5 of n⁺ Si layer, using the horizontal carry system. In the growth chamber 5 of n⁺ Si layer, the wafer cassette is held for 10 minutes before the wafer cassette reached the liquid phase growth temperature. During this period the solvent is cooled by controlling the heater, so that n⁺ Si goes into the supersaturated state.

Then the wafer cassette is dipped into the solvent, using the vertical carry system in the growth chamber 5 of n⁺ Si layer and the temperature of the melt is slowly decreased, so that the n⁺ Si layer 24 of single crystal is epitaxially grown on the surface of p⁻ Si layer 25, as illustrated in FIG. 9C. The period of this growth is approximately 10 minutes.

After that, the wafer cassette is moved from the growth chamber 5 of n⁺ Si layer into the unloading chamber 6, using the horizontal carry system of the core 13. Then the wafer cassette is cooled for 55 minutes to return the temperature of the wafer cassette to room temperature. The wafer cassette is taken out in last 5 minutes. In FIGS. 16A and 16B, letters B, C, and D represent movement of the second batch, the third batch, and the fourth batch, respectively. The wafer cassette of the second batch indicated by B is hydrogen-annealed in the hydrogen annealing chamber 2 and thereafter is moved into the growth chamber 4' of p⁻ Si layer, the p⁻ Si layer 25 of single crystal is grown by the similar step to that of the first batch indicated by A, and then the wafer cassette of the second batch is moved into the growth chamber 5' of n⁺ Si layer, where the n⁺ Si layer 24 of single crystal is grown. The wafer cassette of the third batch indicated by C is moved to the growth chamber 4" of p⁻ Si layer and to the growth chamber 5 of n⁺ Si layer in this order. The wafer cassette of the fourth batch indicated by D is moved to the growth chamber 4 of p⁻ Si layer and to the growth chamber 5' of n⁺ Si layer in this order. The reason why the hydrogen annealing chamber 2 has two rooms and the unloading chamber 6 has three rooms is that each chamber permits two wafer cassette or three wafer cassettes to be put into the rooms at one time. The liquid phase growth apparatus of Embodiment 3 can perform the liquid phase growth of one batch every 20 minutes.

In the liquid phase growth apparatus of Embodiment 3, the liquid phase growth operations are carried out simultaneously in the growth chamber 4 of p⁻ Si layer, in the growth chamber 4" of p⁻ Si layer, and in the growth chamber 5' of n⁺ Si layer, as seen in 130 to 140 minutes in the time charts shown in FIGS. 16A and 16B. In addition, the annealing operation in the hydrogen annealing chamber 2 is carried out simultaneously with the liquid phase growth of p⁻ Si layer in the growth chamber 4" of p⁻ Si layer, as seen in 110 to 120 minutes in the time charts shown in FIGS. 16A and 16B. Further, the annealing operation in the hydrogen annealing chamber 2 is carried out simultaneously with the dissolving operation of the semiconductor material in the growth chamber 4 of p⁻ Si layer, as seen in 50 to 60 minutes of FIGS. 16A and 16B. The time control described above is carried out by the timing control means provided in the liquid phase growth apparatus of the present invention.

Since the liquid phase growth apparatus of Embodiment 3 has the three growth chambers of p⁻ Si layer, the liquid phase growth of p⁻ Si layer, which takes more time for growth, can be performed for a plurality of wafer cassettes at one time. This permits production of solar cells at high throughput.

(Embodiment 4)

Figure 17A:
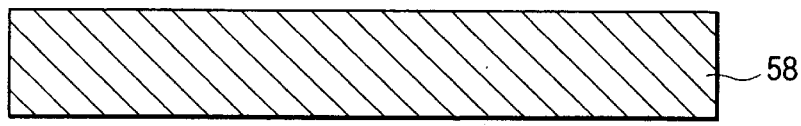
FIG. 17A, FIG. 17B, FIG. 17C, FIG. 17D, and FIG. 17E are sectional views to show production steps of the solar cell in Embodiment 4.
Figure 17B:
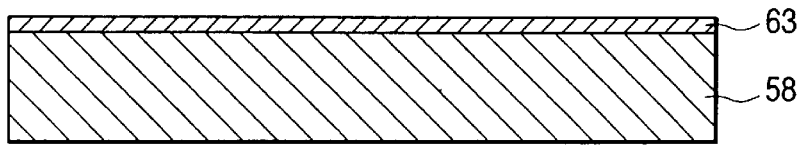
Figure 17C:
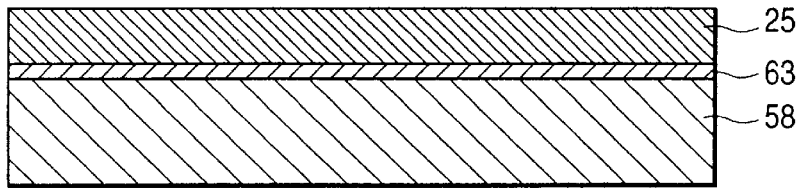
Figure 17D:
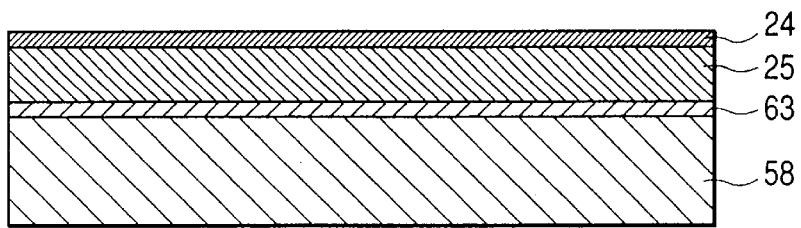
Figure 17E:
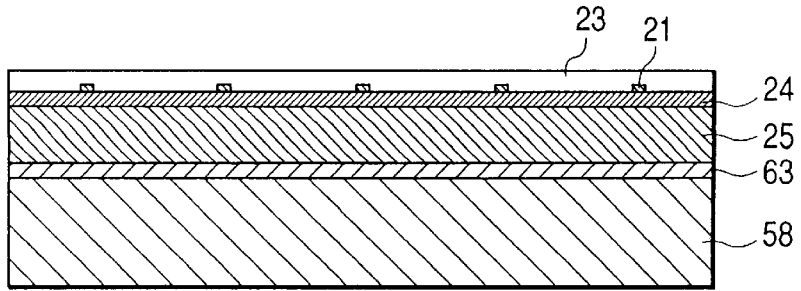

Embodiment 4 is the preferred embodiment of the liquid phase growth apparatus of the two-vessel type or the five-vessel type for producing the polycrystalline solar cells and the liquid phase growth method using it. FIGS. 17A to 17E are sectional views to show the production steps of the solar cell. In the figures, numeral 58 denotes a metal substrate and 63 a barrier layer. The other reference numerals denote the same components as those described above. For producing the solar cell of Embodiment 4, the metal substrate 58 is first prepared as illustrated in FIG. 17A and the barrier layer 63 is then formed as illustrated in FIG. 17B. The barrier layer 63 can be, for example, SiC or $SnO_2$ and the barrier layer 63 can be formed by such a method as sputtering or evaporation. Then the polycrystalline p⁻ Si layer 25 is formed as illustrated in FIG. 17C, using the liquid phase growth apparatus illustrated in FIG. 13 or in FIG. 15, which was described in Embodiment 2 or in Embodiment 3. After that, the polycrystalline n⁺ Si layer 24 is formed as illustrated in FIG. 17D. Since Embodiment 4 does not necessitate the hydrogen annealing operation, the annealing step may be omitted. Then the grid electrodes 21 and antireflection film 23 are formed on the surface of polycrystalline n⁺ Si layer 24, as illustrated in FIG. 17E, thus completing the solar cell. Although Embodiment 4 was described as to the liquid phase growth of the polycrystalline n⁺ Si layer 24 and p⁻ Si layer 25, an ordinary semiconductor such as GaAs or Ge may also be grown by liquid phase growth. The metal substrate 58 may be replaced by a ceramic substrate.

(Embodiment 5)

Figure 18A:
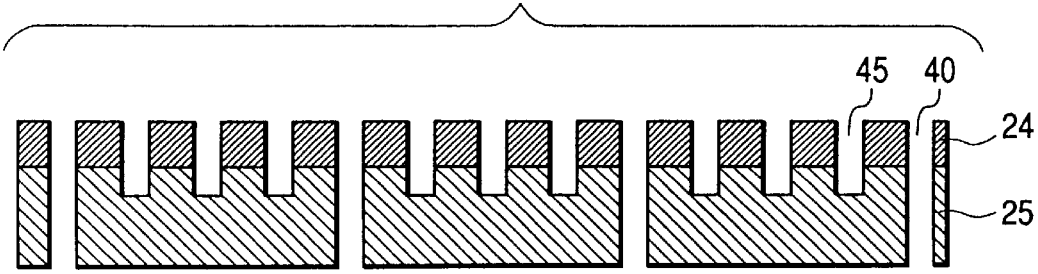
FIG. 18A, FIG. 18B, FIG. 18C, and FIG. 18D are sectional views to show production steps of a photosensor in Embodiment 5.

Embodiment 5 is the preferred embodiment of the liquid phase growth apparatus of the two-vessel type or the five-vessel type for producing photosensors and the liquid phase growth method using it. FIGS. 18A to 18D and FIG. 19A are sectional views to show the production steps of the photosensor. FIGS. 19B to 19C are plan views to show the top surface and the bottom surface of the photosensor completed. First, the epitaxial Si layers 24, 25 are formed in the stack structure of single-crystal p⁻ Si layer 25 and single-crystal n⁺ Si layer 24 by steps similar to those illustrated in FIGS. 9B and 9C of Embodiment 2. Then holes are bored from the surface of n⁺ Si layer 24 through the epitaxial Si layers 24, 25 by laser irradiation or the like in the similar fashion to Embodiment 2 illustrated in FIG. 9D, so as to form the through-holes 40 and expose the porous Si layer 29. The scribe lines 45 for insulating and separating rows or lines of the area sensor are formed by laser irradiation in the similar fashion to the above. Then selective etching of the porous Si layer 29 is carried out by the same step as that in Embodiment 2 illustrated in FIG. 10B, so as to separate the epitaxial Si layers 24, 25 from the Si wafer 28. As a result, the epitaxial Si layers 24, 25 illustrated in FIG. 18A are obtained.

Figure 18B:
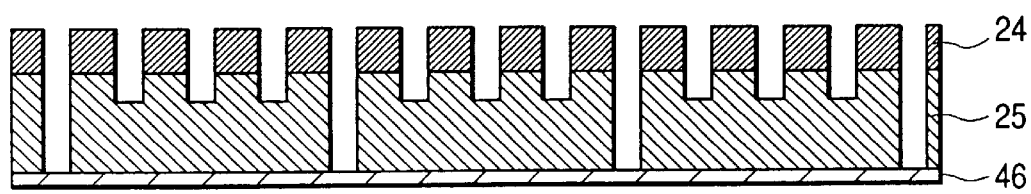
Figure 18C:
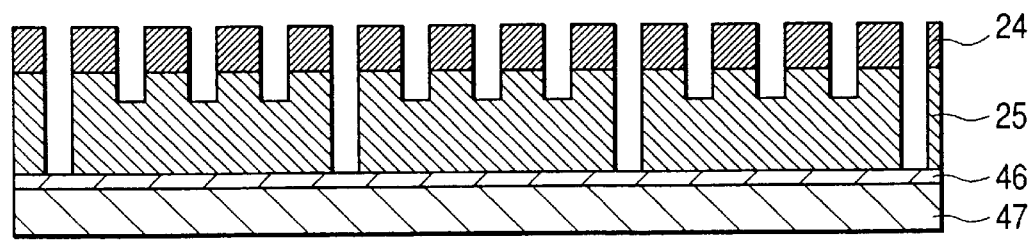
Figure 18D:
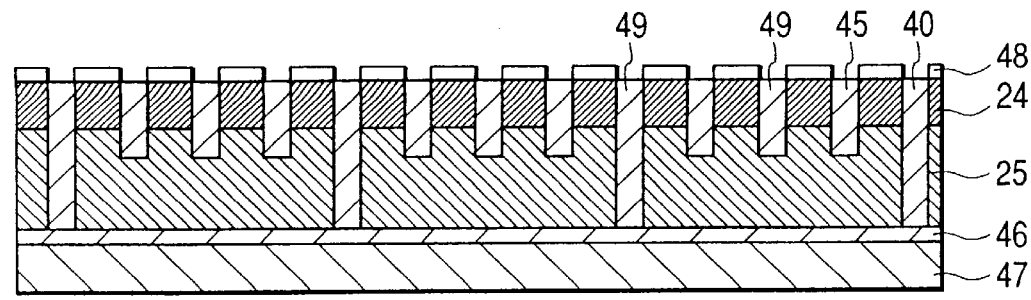

Then back electrodes 46 of stripes extending in the normal direction to the scribe lines 45 are attached to the back surface of the p⁻ Si layer 25, as illustrated in FIG. 18B. Next, a support substrate 47 is attached as illustrated in FIG. 18C. Then transparent electrodes 48 of ITO or the like are formed in stripes on the surface on n⁺ Si layer 24, as illustrated in FIG. 18D. The transparent electrodes 48 and back electrodes 46 are formed so as to constitute a simple matrix. On the other hand, the through-holes 40 and scribe lines 45 are filled with an insulating material if necessary. Numeral 49 represents insulating regions.

Figure 19A:
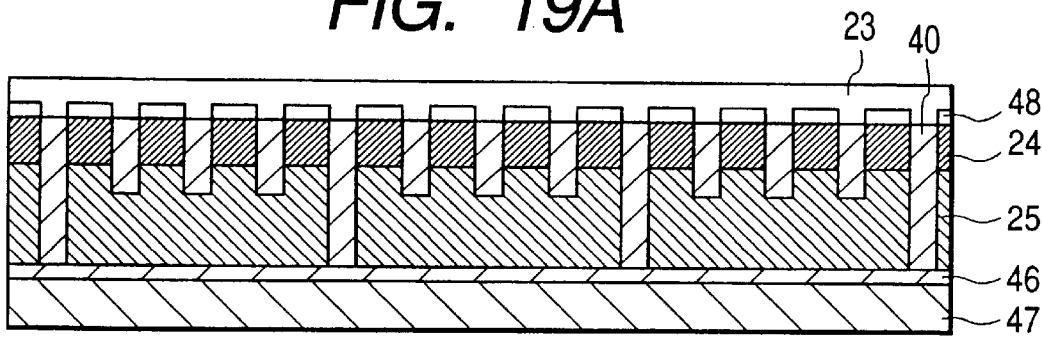
FIG. 19A is a sectional view of the photosensor of Embodiment 5.
Figure 19B:
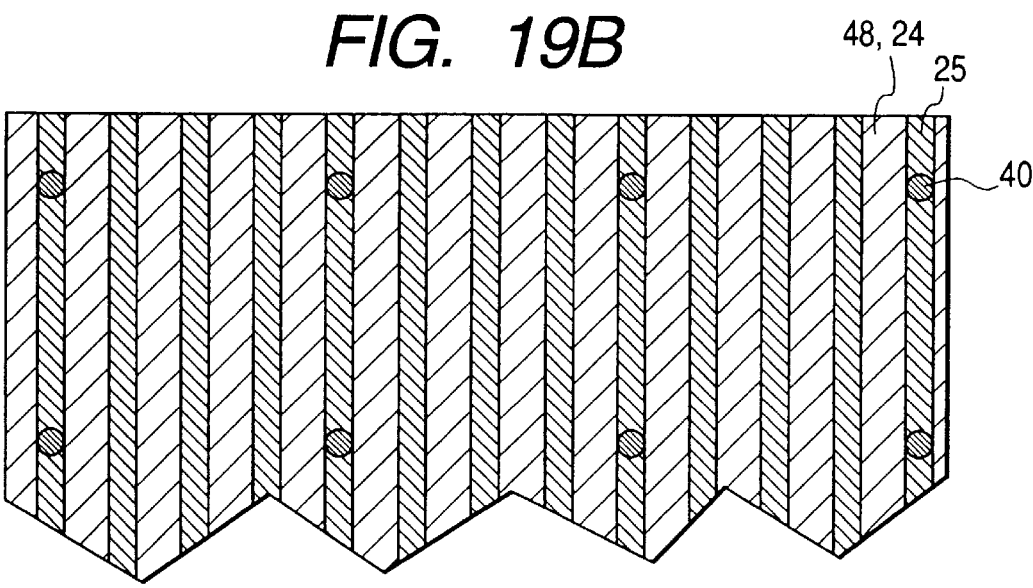
FIG. 19B and FIG. 19C are plan views thereof.
Figure 19C:
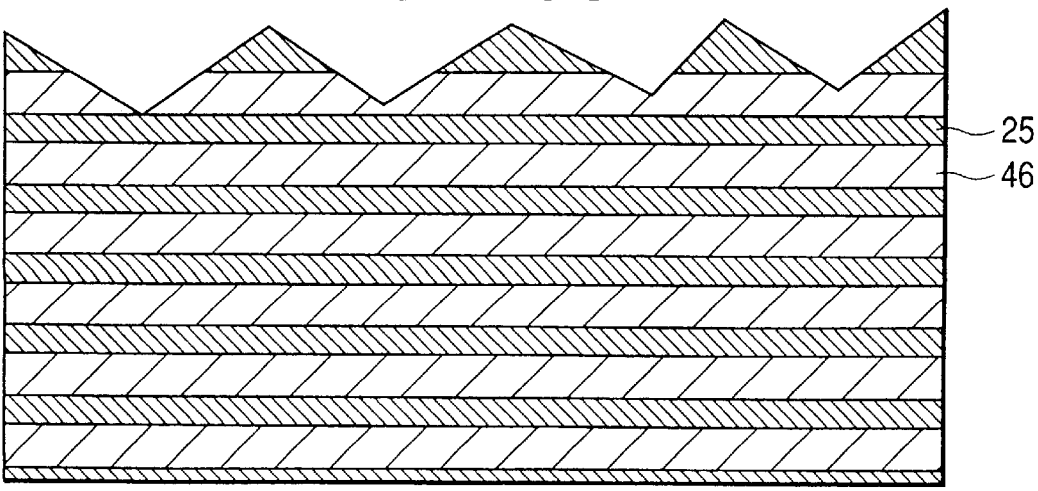
Figure 20:
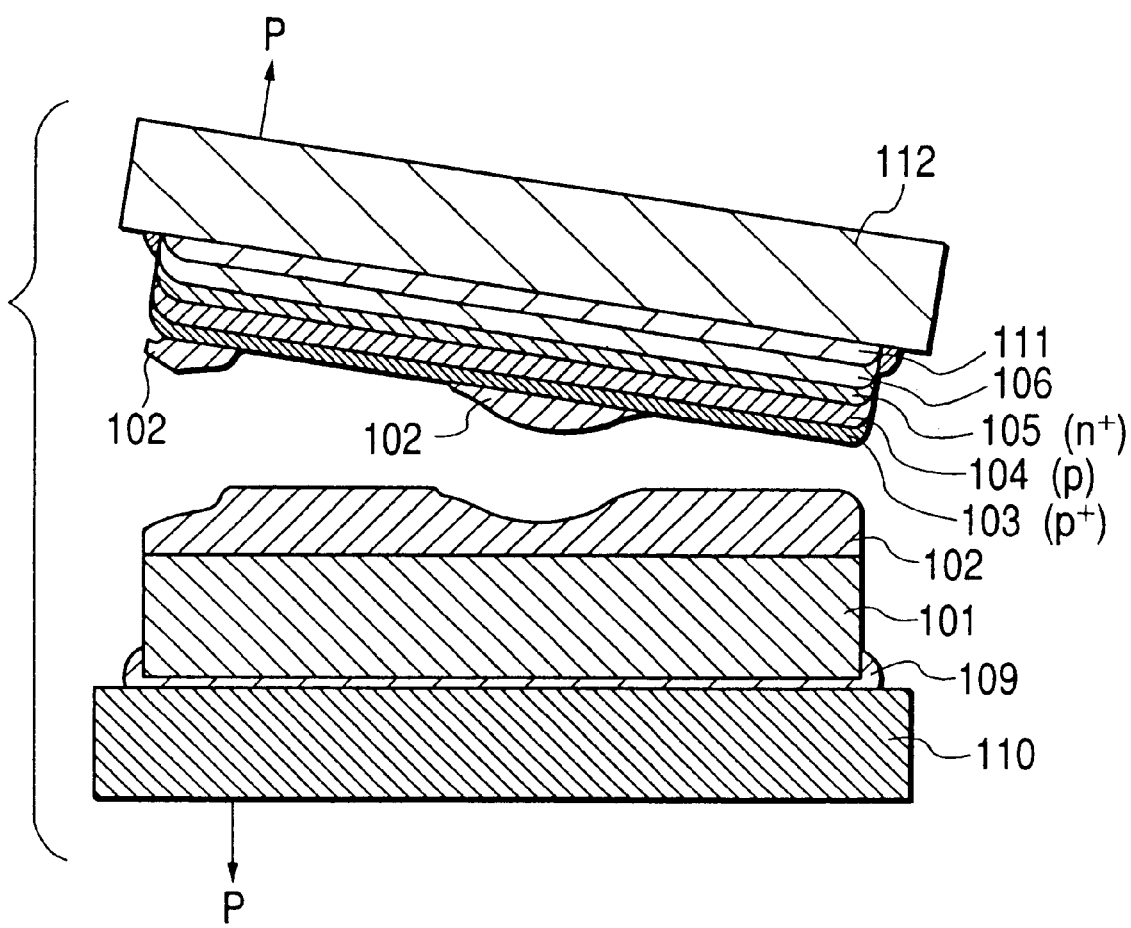
FIG. 20 is a sectional view to show a production step of the conventional solar cell.
Figure 21:
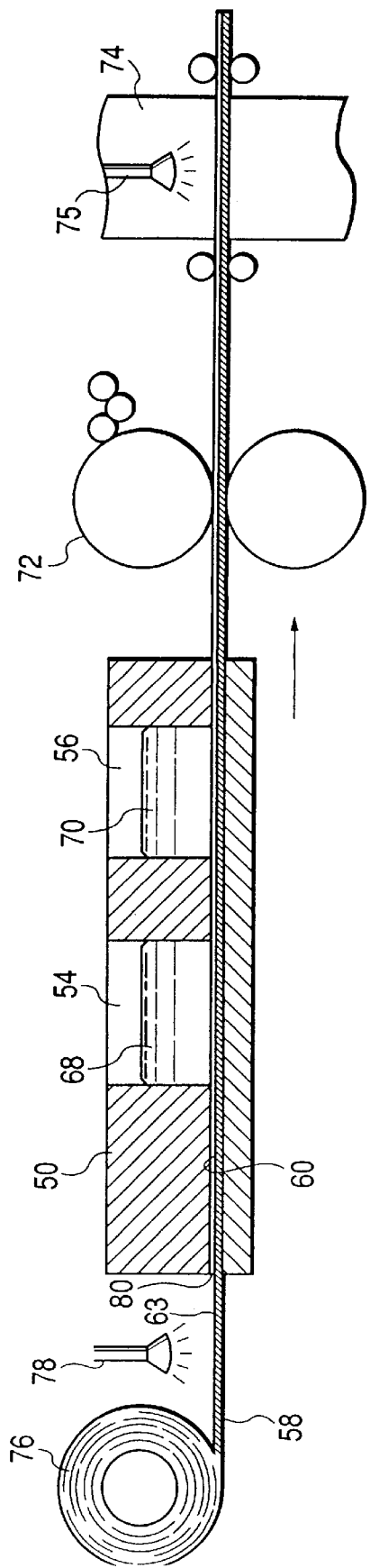
FIG. 21 is a sectional view of the conventional liquid phase growth apparatus of the sliding method.
Figure 22:
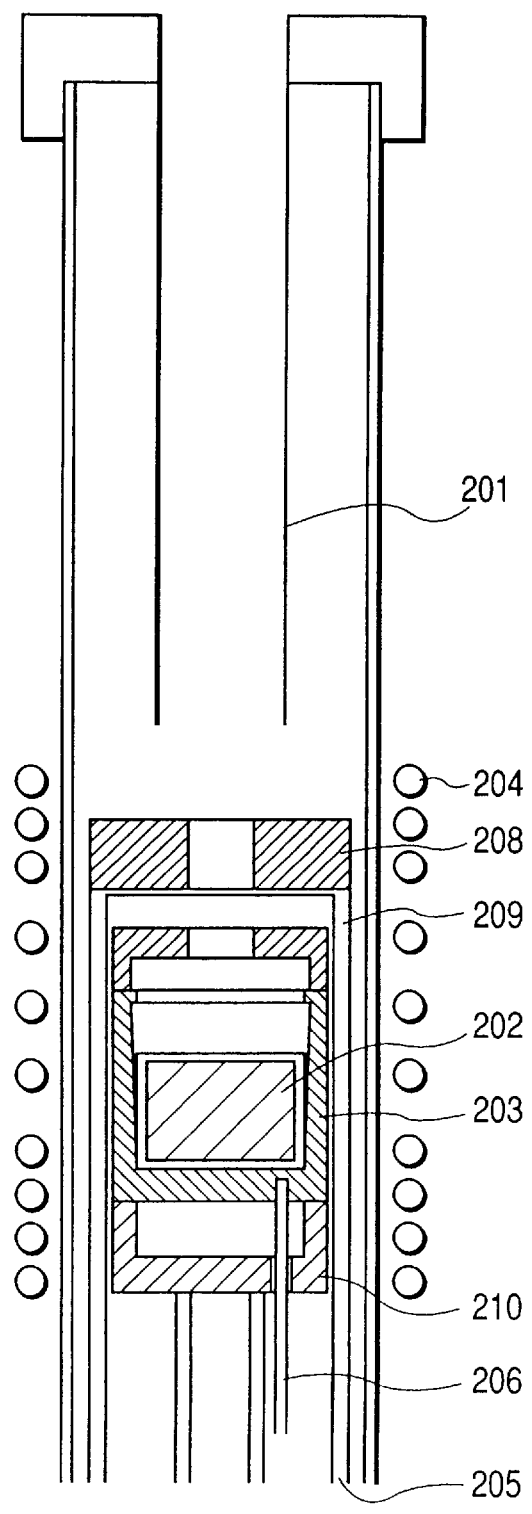
FIG. 22 is a sectional view of the conventional liquid phase growth apparatus of the dipping system.

Then the antireflection layer 23 is formed on the surface on the n⁺ Si layer 24 side as illustrated in FIG. 19A, thereby completing the area sensor. FIG. 19B is a plan view of the side of the antireflection layer 23 and FIG. 19C is a plan view of the side of the support substrate 47. The transparent electrodes 48 are wired in stripes in the vertical direction, whereas the back electrodes 46 are wired in stripes in the horizontal direction. Namely, the transparent electrodes 48 and back electrodes 46 compose the simple matrix and this area sensor has the structure in which this simple matrix sandwiches the p⁻ Si layer 25 and n⁺ Si layer 24 functioning as photodiodes.

The present invention permits efficient mass production of the large-area devices such as the solar cells or the photosensors.

What is claimed is:

1. A liquid phase growth method using a dipping system comprising growing a semiconductor on a plurality of substrates, wherein the semiconductor is liquid-phase grown on said plurality of substrates using a plurality of liquid phase growth chambers, wherein said substrates are transferred between said plurality of liquid phase growth chambers by a system for vertical carrying and a system for horizontal carrying, each of said carrying systems being capable of receiving substrates from and passing substrates to the other.

2. The liquid phase growth method according to claim 1, wherein the semiconductor is liquid-phase grown simultaneously on said plurality of substrates using said plurality of liquid phase growth chambers.

3. A liquid growth method of a dipping system comprising growing a semiconductor on a plurality of substrates, wherein simultaneously with liquid phase growth of the semiconductor on one of said plurality of substrates, another of said plurality of substrates is subjected to annealing, wherein said substrates are transferred to a liquid phase growth chamber and an annealing chamber by a system for vertical carrying and a system for horizontal carrying, each of said carrying systems being capable of receiving substrates from and passing substrates to the other.

4. A liquid phase growth method using a dipping system comprising growing a semiconductor on a plurality of substrates, wherein using a liquid phase growth apparatus having a liquid phase growth chamber and an annealing chamber, the semiconductor is liquid-phase grown on one of said plurality of substrates and another of said plurality of substrates is subjected to annealing, wherein said substrates are transferred to a liquid phase growth chamber and an annealing chamber by a system for vertical carrying and a system for horizontal carrying, each of said carrying systems being capable of receiving substrates from and passing substrates to the other.

5. The liquid phase growth method according to claim 4, wherein simultaneously with the liquid phase growth of the semiconductor on one of said plurality of substrates, another of said plurality of substrates is subjected to annealing.

6. The liquid phase growth method according to claim 4, wherein the annealing of the substrate in said annealing chamber is carried out simultaneously with dissolving a semiconductor material into a solvent in said liquid phase growth chamber.

7. A liquid phase growth apparatus using a dipping system for growing a semiconductor on a plurality of substrates, comprising a plurality of liquid phase growth chambers, wherein said substrates are transferred between said plurality of liquid phase growth chambers by a system for vertical carrying and a system for horizontal carrying, each of said carrying systems being capable of receiving substrates from and passing substrates to the other.

8. The liquid phase growth apparatus according to claim 7, further comprising a timing control means for performing time control of liquid phase growth on the plurality of substrates in the plurality of liquid phase growth chambers.

9. The liquid phase growth apparatus according to claim 8, wherein said timing control means is means for performing such control that liquid phase growth on the plurality of substrates are carried out simultaneously.

10. A liquid phase growth apparatus using a dipping system for growing a semiconductor on a plurality of substrates, comprising a liquid phase growth chamber and an annealing chamber, wherein said substrates are transferred to a liquid phase growth chamber and an annealing chamber by a system for vertical carrying and a system for horizontal carrying, each of said carrying systems being capable of receiving substrates from and passing substrates to the other.

11. The liquid phase growth apparatus according to claim 10, further comprising a timing control means for performing time control of liquid phase growth in the liquid phase growth chamber and annealing in the annealing chamber.

12. The liquid phase growth apparatus according to claim 11, wherein the timing control means is means for performing such control that the liquid phase growth on one of the plurality of substrates and the annealing of another of the plurality of substrates are carried out simultaneously with each other.

13. The liquid phase growth apparatus according to claim 10, further comprising a timing control means for performing time control of dissolution of a semiconductor material into a solvent in the liquid phase growth chamber and annealing in the annealing chamber.

14. The liquid phase growth apparatus according to claim 13, wherein the timing control means is means for performing such control that the dissolution of the semiconductor material into the solvent and the annealing are carried out simultaneously with each other.

15. A liquid phase growth method using a dipping system for growing a semiconductor on a plurality of substrates, comprising performing a step of liquid-phase growing a semiconductor on a substrate in a liquid phase growth chamber and another step of liquid-phase growing a semiconductor on another substrate in another liquid phase growth chamber, simultaneously.

16. The liquid growth method according to claim 15, wherein the composition of the semiconductor grown on said substrate is different from the composition of the semiconductor grown on said another substrate.

17. A liquid phase growth method using a dipping system for growing a semiconductor on a substrate, comprising performing simultaneously at least two steps of: liquid-phase growing a semiconductor on a substrate, annealing another substrate, and dissolving a semiconductor material into a solvent in a liquid phase growth chamber.

18. A liquid phase growth apparatus using a dipping system for growing a semiconductor on a plurality of substrates, comprising a plurality of liquid phase growth chambers and a timing control means for effecting such control that liquid phase growth of a semiconductor on a substrate in one of said plurality of liquid phase growth chambers and liquid phase growth of a semiconductor on another substrate in another of said plurality of liquid phase growth chambers are performed simultaneously.

19. The liquid phase growth method according to claim 18, wherein the composition of the semiconductor grown on said substrate is different from the composition of the semiconductor grown on said another substrate.

20. A liquid phase growth apparatus using a dipping system for growing a semiconductor on a plurality of substrates, comprising a plurality of liquid growth chambers, an annealing chamber, and a timing control means for effecting such control that at least two of: liquid phase growth of a semiconductor on a substrate in one of said plurality of liquid phase growth chambers, annealing of another substrate in said annealing chamber, and dissolution of a semiconductor material into a solvent in said one or another of said plurality of liquid phase growth chambers are performed simultaneously.

* * * * *

UNITED STATES PATENT AND TRADEMARK OFFICE
CERTIFICATE OF CORRECTION

PATENT NO.    : 6,231,667 B1
DATED         : May 15, 2001
INVENTOR(S)   : Masaaki Iwane et al.

It is certified that error appears in the above-identified patent and that said Letters Patent is hereby corrected as shown below:

Title page,
Item [56], References Cited, under FOREIGN PATENT DOCUMENTS, "62-083398 * 4/1987 (KP).......117/54" should read -- 62-083398 * 4/1987 (JP).......117/54 --.

Column 1,
Line 21, "of" should be deleted;
Line 28, "rood file," should read -- roof tile, -- and
Line 43, "$n^-$" should read -- $n^+$ --.

Column 2,
Line 47, "using" should read -- of --;
Line 50, "using" (second occurrence) should be deleted; and
Line 53, "using" should read -- of --.

Column 3,
Line 58, "(Embodiment 1;" should read -- Embodiment 1; --.

Column 5,
Line 9, "$n^-$" should read -- $n^+$ --.
Line 14, "$n^-$" should read -- $n^+$ --.
Line 25, "34 and" should read -- 34 an --; and
Line 64, "$n^-$" should read -- $n^+$ --.

Column 6,
Line 2, "$n^{-60}$" should read -- $n^+$ --;
Line 12, "$p^-$" should read -- $p^+$ --;
Line 21, "$p^-$" should read -- $p^+$ --;
Line 22, "$n^-$" should read -- $n^+$ --;
Line 26, "$p^-$" (first occurrence) should read -- $p^+$ --;
Line 38, "$n^-$" should read -- $n^+$ --;
Line 39, "$p^-$" should read -- $p^+$ --; and "$p^{-60}$" should read -- p --.

Column 7,
Line 33, "$p^-$" should read -- $p^+$ --;
Line 36, "$p^-$" should read -- $p^+$ --;
Line 41, "$p^-$" should read -- $p^+$ --;
Line 60, "$p^{-60}$" should read -- $p^-$ --.

UNITED STATES PATENT AND TRADEMARK OFFICE
CERTIFICATE OF CORRECTION

PATENT NO.   : 6,231,667 B1
DATED        : May 15, 2001
INVENTOR(S)  : Masaaki Iwane et al.

It is certified that error appears in the above-identified patent and that said Letters Patent is hereby corrected as shown below:

<u>Column 8,</u>
Line 4, "$p^{-60}$" should read -- $p^-$ --;
Line 16, "$n^-$" should read -- $n^+$ --;
Line 17, "$n^-$" should read -- $n^+$ --; and
Line 55, "times" should read -- time --.

<u>Column 9,</u>
Line 27, "$p^-$" should read -- $p^+$ --; and
Line 30, "$p^-$" should read -- $p^+$ --.

<u>Column 10,</u>
Line 22, "in" should read -- is --.

<u>Column 12,</u>
Line 11, "$n^+O$" should read -- $n^+$ --.

<u>Column 15,</u>
Line 56, "are" should read -- is --.

Signed and Sealed this

Twentieth Day of August, 2002

Attest:

JAMES E. ROGAN
*Attesting Officer*     *Director of the United States Patent and Trademark Office*